US012757588B2

(12) United States Patent
Yun et al.

(10) Patent No.: US 12,757,588 B2
(45) Date of Patent: Oct. 6, 2026

(54) DISPLAY DEVICE AND METHOD FOR MANUFACTURING THE SAME

(71) Applicant: SAMSUNG DISPLAY CO., LTD., Yongin-si (KR)

(72) Inventors: Sung Sik Yun, Yongin-si (KR); Ju Yeon Seo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 359 days.

(21) Appl. No.: 18/605,002

(22) Filed: Mar. 14, 2024

(65) Prior Publication Data

US 2025/0056978 A1 Feb. 13, 2025

(30) Foreign Application Priority Data

Aug. 8, 2023 (KR) ........................ 10-2023-0103241

(51) Int. Cl.

*H10K 50/88* (2023.01)
*H10K 59/12* (2023.01)
*H10K 59/121* (2023.01)
*H10K 59/124* (2023.01)
*H10K 59/131* (2023.01)
*H10K 59/40* (2023.01)
*H10K 59/80* (2023.01)
*H10K 59/82* (2023.01)
(Continued)

(52) U.S. Cl.

CPC ........... *H10K 59/124* (2023.02); *H10K 50/88* (2023.02); *H10K 59/875* (2023.02); *H10K 59/1213* (2023.02)

(58) Field of Classification Search

CPC ............... H10K 59/124; H10K 59/875; H10K 59/1213; H10K 59/131; H10K 59/82; H10K 50/88

See application file for complete search history.

(56) References Cited

U.S. PATENT DOCUMENTS

2021/0132666 A1* 5/2021 Kim ...................... G06F 1/1609
2021/0191552 A1* 6/2021 Bok .......................... G09G 3/32
(Continued)

FOREIGN PATENT DOCUMENTS

KR 10-2021-0131508 A 11/2021
KR 10-2022-0100146 A 7/2022
(Continued)

*Primary Examiner* — Mohsen Ahmadi
(74) *Attorney, Agent, or Firm* — F. CHAU & ASSOCIATES, LLC

(57) ABSTRACT

A display device according to an embodiment includes a display area and a pad area, a first insulating layer on the substrate, a second insulating layer on the first insulating layer, and a first opening adjacent to a contact portion of the pad area and a well portion surrounding the contact portion, a pad on the first insulating layer and including a first conductive layer, an organic layer in the well portion, and a third insulating layer on the second insulating layer and the organic layer, and covering the first conductive layer and the organic layer around the contact portion, wherein the first conductive layer includes a first portion in the first opening, a second portion extending from the first portion to an edge of the contact portion, and a third portion extending from the second portion into the well portion, and the organic layer covers the third portion.

20 Claims, 18 Drawing Sheets

(51) Int. Cl.
*H10K 71/00* (2023.01)
*H10K 71/60* (2023.01)

(56) References Cited

U.S. PATENT DOCUMENTS

| | | | | |
|---|---|---|---|---|
| 2021/0399072 | A1* | 12/2021 | Song | H10K 59/1216 |
| 2023/0041748 | A1* | 2/2023 | Tak | H10H 29/142 |
| 2024/0107857 | A1* | 3/2024 | Lee | H10P 72/0424 |
| 2024/0118779 | A1* | 4/2024 | Han | G06F 3/0446 |
| 2024/0147793 | A1* | 5/2024 | Kim | H10K 59/131 |
| 2024/0237473 | A1* | 7/2024 | Kang | H10K 59/1201 |
| 2024/0334782 | A1* | 10/2024 | Kim | H10K 59/871 |
| 2025/0014505 | A1* | 1/2025 | Kang | H10K 59/131 |
| 2025/0015244 | A1* | 1/2025 | Kwak | H10H 20/857 |
| 2025/0048840 | A1* | 2/2025 | Lee | H10K 59/873 |
| 2025/0053266 | A1* | 2/2025 | Park | G06F 3/0416 |

FOREIGN PATENT DOCUMENTS

| | | |
|---|---|---|
| KR | 10-2023-0003702 A | 1/2023 |
| KR | 10-2520493 | 4/2023 |

* cited by examiner

DISPLAY DEVICE AND METHOD FOR MANUFACTURING THE SAME

CROSS-REFERENCE TO RELATED APPLICATION

This application claims priority under 35 U.S.C. 119 to Korean Patent Application No. 10-2023-0103241 filed on Aug. 8, 2023, in the Korean Intellectual Property Office, and all the benefits accruing therefrom, the contents of which in its entirety are herein incorporated by reference.

BACKGROUND

1. Technical Field

The present disclosure relates to a display device and a method for manufacturing the same.

2. Description of the Related Art

The importance of display devices has steadily increased with the development of multimedia technology. Accordingly, various types of display devices such as a liquid crystal display device, a light emitting display device and the like have been developed.

A display device includes a display panel including a display area in which pixels are arranged and a pad area in which pads are arranged. The pads can be connected to a driving circuit or a circuit board to transmit input/output signals of the display panel.

SUMMARY

Aspects of the present disclosure provide a display device capable of improving reliability of a pad area and a method for manufacturing the same.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an aspect of the present disclosure, there is provided a display device including, a substrate including a display area and a pad area, a first insulating layer on the substrate, a second insulating layer on the first insulating layer, and including a first opening adjacent to a contact portion of the pad area and a well portion surrounding the contact portion, a pad on the first insulating layer in the contact portion and around the contact portion, wherein the pad includes a first conductive layer, an organic layer in the well portion, and a third insulating layer on the second insulating layer and the organic layer, and covering the first conductive layer and the organic layer around the contact portion, wherein the first conductive layer includes a first conductive layer portion in the first opening, a second conductive layer portion extending from the first conductive layer portion to an edge of the contact portion, and a third conductive layer portion extending from the second conductive layer portion into the well portion and including an end of the first conductive layer, and the organic layer covers the third conductive layer portion of the first conductive layer.

In an embodiment, the organic layer may fill the well portion.

In an embodiment, the organic layer may have a height equal to or less than a height of the second insulating layer, and may planarize a step formed in the second insulating layer due to the well portion.

In an embodiment, the organic layer may surround the first opening at a position laterally spaced apart from the first opening.

In an embodiment, the second conductive layer portion of the first conductive layer may be on the second insulating layer.

In an embodiment, the second insulating layer may include a second opening exposing the first insulating layer, and the end of the first conductive layer may be on the first insulating layer in the well portion.

In an embodiment, the second insulating layer may include a plurality of insulating layers including the second opening in the well portion.

In an embodiment, the second insulating layer may include a recess, and the end of the first conductive layer may be in the recess of the second insulating layer.

In an embodiment, the second insulating layer may include an upper insulating layer including the second opening in the well portion, and a lower insulating layer under the upper insulating layer.

In an embodiment, the first conductive layer may include a first metal layer containing a first metal, a second metal layer on the first metal layer and containing a second metal, and a third metal layer on the second metal layer and containing the first metal, and the organic layer may covers the end of the first conductive layer.

According to an aspect of the present disclosure, there is provided a display device including, a substrate including a display area and a pad area, a first insulating layer on the substrate, a second insulating layer on the first insulating layer, and including a first opening adjacent to a contact portion of the pad area and a well portion surrounding the contact portion, a pad on the first insulating layer in the contact portion and around the contact portion, wherein the pad includes a first conductive layer, an organic layer in the well portion, and a third insulating layer on the second insulating layer and the organic layer, and covering the first conductive layer and the organic layer around the contact portion, wherein the first conductive layer includes a first conductive layer portion in the first opening, a second conductive layer portion extending from the first conductive layer portion to an edge of the contact portion, and a third conductive layer portion extending from the second conductive layer portion into the well portion and including an end of the first conductive layer, and the organic layer covers the third portion of the first conductive layer, where the pad may further include at least one of, a second conductive layer between the first insulating layer and the first conductive layer, exposed by the first opening in the contact portion, and covered with the second insulating layer around the contact portion, and a third conductive layer between the second conductive layer and the first conductive layer, in the first opening in the contact portion, and on the second insulating layer around the contact portion.

In an embodiment, the display device may further include a pixel including a transistor in the display area. The transistor may include an active layer between the substrate and the first insulating layer, a gate electrode on the first insulating layer, and a source electrode and/or a drain electrode on the second insulating layer.

In an embodiment, the display device may further include a planarization layer on the transistor and containing an organic insulating material. The organic layer may contain a same organic insulating material as the planarization layer.

In an embodiment, the display device may further include a connection electrode between the transistor and the planarization layer in the display area. The first conductive layer may contain a same conductive material as the connection electrode.

In an embodiment, the second conductive layer may contain a same conductive material as the gate electrode, and the third conductive layer may contain a same conductive material as the source electrode and/or a drain electrode.

In an embodiment, the display device may further include a plurality of pads located in the pad area. The third insulating layer may include a slit-shaped opening located between the pads.

In an embodiment, the pad may further include a fourth conductive layer on the first conductive layer in the contact portion and on the third insulating layer around the contact portion.

In an embodiment, the display device may further include pixels in the display area, and sensor electrodes on the pixels. The third insulating layer may include at least one insulating layer between the pixels and the sensor electrodes.

According to an aspect of the present disclosure, there is provided a method for manufacturing a display device including, sequentially forming a first insulating layer and a second insulating layer on a substrate including a pad area including a contact portion, forming a first opening in the second insulating layer in the contact portion, and forming a well portion in the second insulating layer around the contact portion, by etching the second insulating layer in the contact portion and around the contact portion, forming a first conductive layer of a pad on the first insulating layer and the second insulating layer in the contact portion and around the contact portion, and forming an organic layer in the well portion, wherein the first conductive layer is formed such that a center of the first conductive layer is located in the first opening, and an end of the first conductive layer is located in the well portion, and the organic layer is filled in the well portion to cover the end of the first conductive layer and planarize a step formed in the second insulating layer due to the well portion.

In an embodiment, the method may further include forming a third insulating layer on the first conductive layer and the organic layer around the contact portion, and forming a slit-shaped opening in the third insulating layer at an edge of a region including the contact portion and the well portion.

According to embodiments, it is possible to provide a display device including an insulating layer having a well portion surrounding a contact portion of a pad area, a pad located in the contact portion and having a conductive layer extending into the well portion, and an organic layer in the well portion to cover an end of the conductive layer, and a method for manufacturing the same. According to embodiments, by cladding the end of the conductive layer provided in the pad with the organic layer, the conductive layer may be prevented from being additionally etched in a subsequent process, causing a defect in the pad area. In addition, by forming the well portion in the insulating layer around the contact portion and disposing the organic layer inside the well portion, a step caused by the organic layer may be prevented, reduced, or minimized. Accordingly, it is possible to prevent or minimize the insulating layer above the organic layer from being damaged or unstuck due to a conductive ball or the like used in the process of connecting the pad and a driving circuit. Accordingly, the reliability of the pad area may be improved.

In some embodiments, the insulating layer above the organic layer may include an opening positioned between pads. According to these embodiments, even if a crack, lifting, or peeling occurs in the insulating layer above the organic layer in a part of the pad area, damage to the insulating layer may be blocked, reduced, or minimized from being propagated to the surroundings. Accordingly, the reliability of the pad area may be further improved.

However, effects according to the embodiments of the present disclosure are not limited to those exemplified above and various other effects are incorporated herein.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF THE EMBODIMENTS

The various embodiments of the present invention are described more fully hereinafter with reference to the accompanying drawings. The various features and aspects of the present invention may, however, be embodied in different forms and should not be construed as limited to the embodiments set forth herein. It will be understood that when an element or a layer is referred to as being "on" another element or layer, it can be directly on the other element or layer, or intervening layers may also be present. The same reference numbers indicate the same components throughout the specification.

It will also be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Features of each of various embodiments of the present disclosure may be partially or entirely combined with each other, and respective embodiments may be implemented independently of each other or may be implemented together in association with each other.

Figure 1:
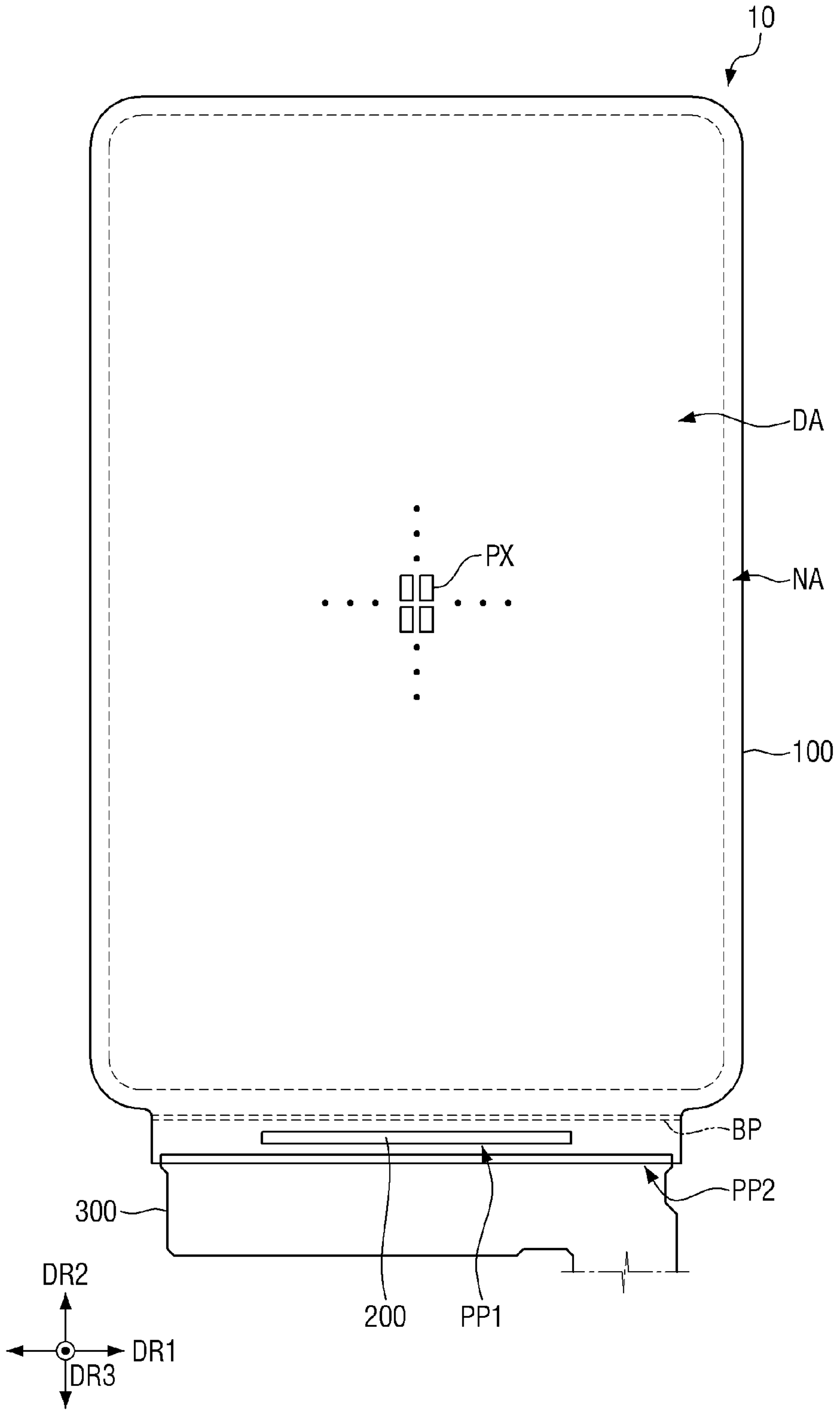
FIG. 1 is a plan view illustrating a display device according to an embodiment.
Figure 2:
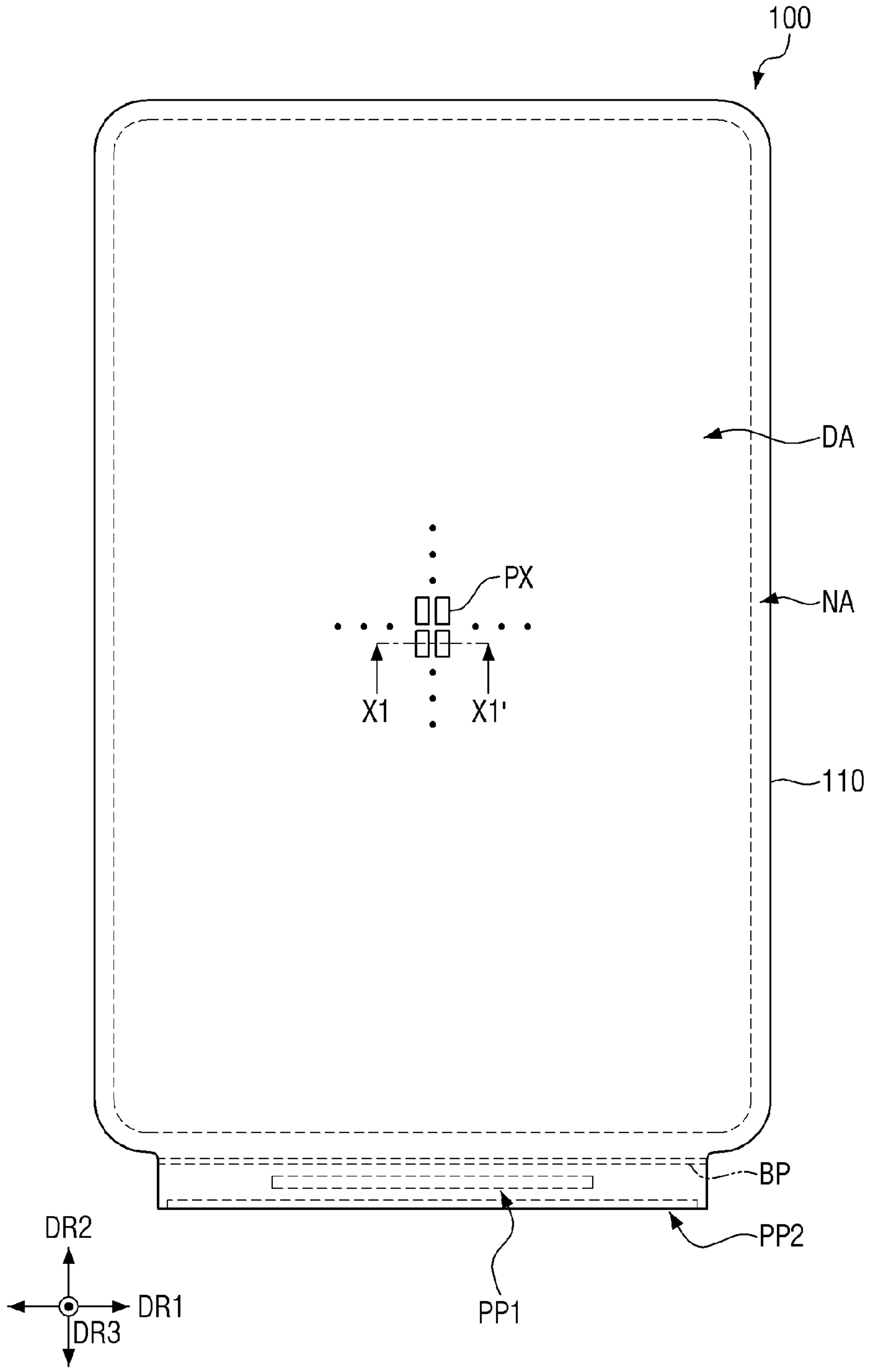
FIG. 2 is a plan view illustrating a display panel of FIG. 1.

FIG. 1 is a plan view illustrating a display device 10 according to an embodiment. FIG. 2 is a plan view illustrating a display panel 100 of FIG. 1.

Referring to FIGS. 1 and 2, the display device 10 may include the display panel 100, a driving circuit 200 connected to the display panel 100, and a circuit board 300. The display panel 100 may include a display unit on which an image is displayed. The driving circuit 200 and the circuit board 300 may constitute a driving unit that generates and/or transmits driving signals of the display panel 100.

In various embodiments, the display panel 100 may include a display area DA in which pixels PX are disposed and an image is displayed. In various embodiments, the display panel 100 may include a touch sensor having sensor electrodes disposed in at least a part of the display area DA. The display device 10 may detect a touch input in the area, where the touch sensor is provided.

In various embodiments, the display panel 100 may include a substrate 110 forming a base surface, and the pixels PX disposed on the substrate 110, as shown in FIG. 2. The pixels PX may be disposed and/or formed in the display area DA on the substrate 110.

In various embodiments, the display area DA may include a short side in a first direction DR1 and a long side in a second direction DR2 and may be formed as a plane having an approximately rectangular shape. A corner portion at which the long side and the short side of the display area DA meet may be rounded or right-angled. The shape of the display area DA may be variously changed according to the embodiments. For example, the display area DA may be formed in a polygonal shape other than a quadrilateral shape, a circular shape, an elliptical shape, or the like. In FIGS. 1 and 2, the first direction DR1 and the second direction DR2 may be a horizontal direction (or a row direction) and a vertical direction (or a column direction) of the display panel 100, respectively. A third direction DR3 may be a direction crossing the main surface of the display panel 100 defined by the first direction DR1 and the second direction DR2. For example, the third direction DR3 may be a thickness direction of the display panel 100 or substrate 110.

In various embodiments, the display panel 100 may be formed substantially flat on a plane defined by the first direction DR1 and the second direction DR2, and may have a predetermined thickness (or height) in the third direction DR3. In another embodiment, the display panel 100 may include a curved surface in at least a part including an edge region and the like. In addition, the display panel 100 may be formed flexibly so that it can be curved, bent, folded, or rolled.

In various embodiments, the display panel 100 may further include a non-display area NA located around the display area DA. The non-display area NA is an area of the display panel 100 other than the display area DA, and may surround the display area DA.

In various embodiments, the display panel 100 may further include pads PD (see e.g., FIG. 4) disposed in the non-display area NA on the substrate 110. The pads may be disposed in at least one pad area located in the non-display area NA. For example, the non-display area NA may include a first pad area PP1 (also referred to as "first pad portion") and a second pad area PP2 (also referred to as "second pad portion"), and multiple pads may be arranged and/or formed in each of the first pad area PP1 and the second pad area PP2.

In various embodiments, the pads located in the first pad area PP1 may be electrically connected to the driving circuit 200. The pads located in the second pad area PP2 may be electrically connected to the circuit board 300.

In various embodiments, the display panel 100 may include a bending area BP (also referred to as "bending portion"). In various embodiments, the bending area BP may be positioned across the display panel 100 in the first direction DR1 between the display area DA and the second pad area PP2.

In various embodiments, the display panel 100 may be bent at the bending area BP. When the display panel 100 is of a top emission type, the display panel 100 may be bent in the bending area BP such that the first pad area PP1, the second pad area PP2, the driving circuit 200, and the circuit board 300 located further from the display area DA than the bending area BP may be located on the rear surface of the display panel 100. Accordingly, the width of a bezel area may be reduced or minimized. Whether the display panel 100 is bent and/or the position of the bending area BP may be modified in various ways according to embodiments, where for example, the bending area BP may be positioned across the display area DA and the non-display area NA.

In various embodiments, the driving circuit 200 may include a data driving circuit for supplying data signals to the pixels PX. In various embodiments, the driving circuit 200 may be provided as an integrated circuit chip and mounted in the first pad area PP1. The driving circuit 200 may be electrically connected to the display panel 100 through the pads located in the first pad area PP1.

In various embodiments, the circuit board 300 may be disposed on the second pad area PP2. For example, the circuit board 300 may be bonded onto the pads located in the second pad area PP2, and may supply or transmit power voltages and driving signals for driving the display panel 100 and/or the driving circuit 200 to the pads located in the second pad area PP2. In various embodiments, where the display panel 100 further includes a touch sensor, the circuit board 300 may supply driving signals for driving at least some sensor electrodes (for example, driving electrodes) to the display panel 100 and receive sensing signals outputted from at least some sensor electrodes (for example, sensing electrodes). The circuit board 300 may be a flexible film such as a flexible printed circuit board (FPCB), a printed circuit board (PCB), or a chip on film (COF), but is not limited thereto.

Figure 3:
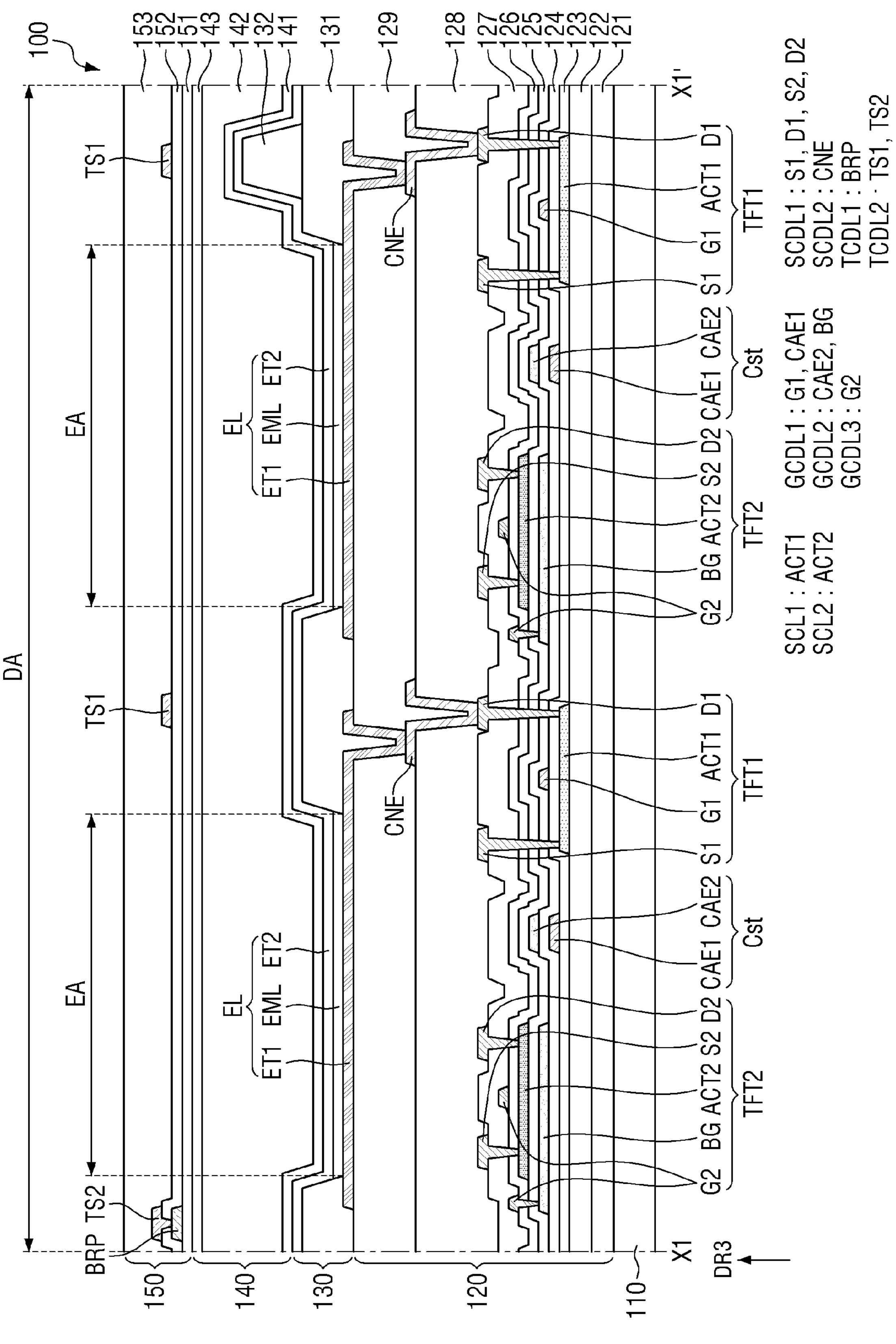
FIG. 3 is a cross-sectional view showing a display area of the display panel according to an embodiment.

FIG. 3 is a cross-sectional view showing the display area DA of the display panel 100 according to an embodiment. For example, FIG. 3 illustrates an example of a cross section of a portion of the display area DA corresponding to line X1-X1' of FIG. 2.

FIG. 3 illustrates a light emitting display panel including a light emitting element EL (for example, an organic light emitting diode). However, the structures and types of the display panel 100 and the display device 10, including the display panel 100, according to embodiments, are not limited thereto. For example, the display device 10 may be a light emitting display device, such as an organic light emitting display including an organic light emitting diode, a quantum dot light emitting display including a quantum dot light emitting layer, an inorganic light emitting display including an inorganic semiconductor, or a light emitting display using an ultra-small light emitting diode such as a micro or nano light emitting diode (micro LED or nano LED). In addition, the display device 10 may be of a type other than the light emitting display device.

Referring to FIG. 3 in addition to FIGS. 1 and 2, the display panel 100 may include the substrate 110, and a circuit layer 120, a light emitting element layer 130, and an encapsulation layer 140 disposed on the substrate 110. In various embodiments, the circuit layer 120, the light emitting element layer 130, and the encapsulation layer 140 may be sequentially arranged and/or stacked on the substrate 110 along the third direction DR3. In describing the embodiments, the circuit layer 120 and the light emitting element layer 130 are separately described, but the embodiments are not limited thereto. For example, the circuit layer 120 and the light emitting element layer 130 may be integrated.

In various embodiments, the display panel 100 may further include a sensor layer 150 (for example, a touch sensor layer) having sensor electrodes of a touch sensor, where the sensor layer 150 may be disposed on the encapsulation layer 140. The type, structure, and/or position of the sensor layer 150 may be modified in various ways according to the embodiments.

In various embodiments, the substrate 110 may include the display area DA and the non-display area NA, as a base member for forming the display panel 100. The non-display area NA of the substrate 110 may include a pad area. For example, the substrate 110 may include the first pad area PP1 and the second pad area PP2 located in different portions of the non-display area NA.

In various embodiments, the substrate 110 may be a flexible substrate that can be transformed, such as by bending, folding, or rolling. The substrate 110 may include an insulating material, such as a polymer resin, where for example, the substrate 110 may be made of polyimide or another insulating material. In various embodiments, the substrate 110 may be a rigid substrate containing an insulating material such as glass, and may not be bent.

In various embodiments, the circuit layer 120 may include pixel circuits provided in the pixels PX and wires connected to the pixels PX. For example, the circuit layer 120 may include circuit elements constituting a pixel circuit of each of the pixels PX and wires, for example, scan lines, data lines, power lines, etc., connected to the pixels PX.

Among the elements that may be provided in the circuit layer 120 in the display area DA, there may be a first transistor TFT1 (also referred to as "first thin film transistor"), a second transistor TFT2 (also referred to as "second thin film transistor"), and a capacitor Cst included in the pixel circuit of each pixel PX, as illustrated in FIG. 3. In addition, FIG. 3 illustrates the display panel 100 having a structure in which the first transistor TFT1 and the second transistor TFT2 include a first active layer ACT1 and a second active layer ACT2 disposed in different layers in the circuit layer 120, respectively. However, embodiments are not limited thereto. For example, the active layers of the transistors included in the pixel circuit may be disposed on the same layer.

Figure 5:
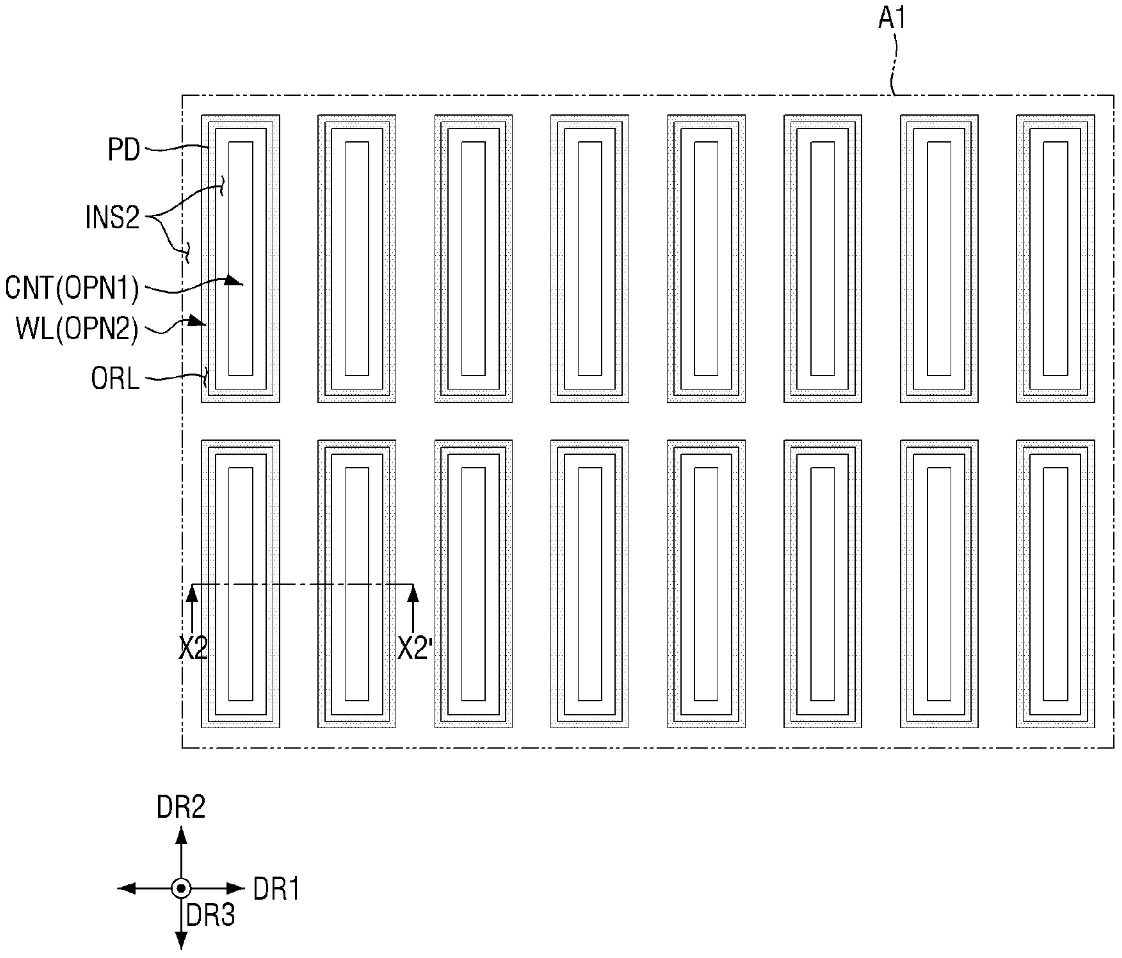
FIG. 5 is a plan view illustrating a pad area of the display panel according to an embodiment.

In various embodiments, the first transistor TFT1 may represent a first type transistor (e.g., a P-type transistor), including a first semiconductor material (e.g., polysilicon), among the transistors constituting each pixel circuit. FIG. 5 illustrates, as the first transistor TFT1, a transistor connected to the light emitting element EL of the pixel PX through a connection electrode CNE. The second transistor TFT2 may represent a second type transistor (e.g., an N type transistor), including a second semiconductor material (e.g., an oxide semiconductor), among the transistors constituting each pixel circuit.

Cross sections of the pixels PX may be variously changed, according to each of the pixels PX and the type and/or structure of the display panel 100, including the pixel PX. For example, positions and order of formation of the first transistor TFT1, the second transistor TFT2, and the capacitor Cst may vary according to the various embodiments.

In various embodiments, the circuit layer 120 may include semiconductor layers for forming circuit elements, wires, or the like, conductive layers, and insulating layers disposed between and/or around the semiconductor layers and the conductive layers. For example, the circuit layer 120 may include a first semiconductor layer SCL1 (e.g., a polysilicon semiconductor layer), a first gate insulating layer 123 (also referred to as "first insulating layer INS" or "first inorganic insulating layer"), a first gate conductive layer GCDL1, a second gate insulating layer 124 (also referred to as "second inorganic insulating layer"), a second gate conductive layer GCDL2, a first interlayer insulating layer 125 (also referred to as "third inorganic insulating layer"), a second semiconductor layer SCL2 (e.g., an oxide semiconductor layer), a third gate insulating layer 126 (also referred to as "fourth inorganic insulating layer"), a third gate conductive layer GCDL3, a second interlayer insulating layer 127 (also referred to as "fifth inorganic insulating layer"), a first source-drain conductive layer SCDL1 (also referred to as "first data conductive layer"), and a first planarization layer 128 (also referred to "first organic insulating layer") that are sequentially disposed on the substrate 110 in the third direction DR3.

In various embodiments, the circuit layer 120 may not include the second semiconductor layer SCL2, or the like. For example, in the display panel 100 in which the pixels PX include transistors of the same type and the active layers of these transistors are all formed on the same layer, the circuit layer 120 may not include the second semiconductor layer SCL2, the third gate insulating layer 126, and/or the third gate conductive layer GCDL3.

In various embodiments, the circuit layer 120 may further include at least one conductive layer and at least one insulating layer disposed on the first planarization layer 128. For example, the circuit layer 120 may include a second source-drain conductive layer SCDL2 (also referred to as "second data conductive layer") and a second planarization layer 129 (also referred to as "second organic insulating layer") that are sequentially disposed on the first planarization layer 128.

In various embodiments, the circuit layer 120 may further include at least one insulating layer and/or at least one conductive layer disposed between the substrate 110 and the first semiconductor layer SCL1. For example, the circuit layer 120 may include a buffer layer 121 (or a barrier layer) and a barrier layer 122 (or a buffer layer) disposed between the substrate 110 and the first semiconductor layer SCL1. In various embodiments, the circuit layer 120 may further include a lower conductive layer disposed between the buffer layer 121 and the barrier layer 122 and including at least one wire and/or conductive light blocking layer.

At least some of the insulating layers provided in the circuit layer 120 in the display area DA may be disposed in the non-display area NA as well. For example, the inorganic insulating layers provided in the circuit layer 120 (e.g., the buffer layer 121, the barrier layer 122, the first gate insulating layer 123, the second gate insulating layer 124, the first interlayer insulating layer 125, the third gate insulating layer 126, and the second interlayer insulating layer 127), or at least two of these inorganic insulating layers may also be disposed around the pads arranged in the non-display area NA.

In various embodiments, the buffer layer 121 and the barrier layer 122 may include at least one inorganic insulating layer containing an inorganic insulating material (e.g., silicon nitride, silicon oxide, silicon oxynitride, titanium oxide, aluminum oxide, or another inorganic insulating material), where each of the buffer layer 121 and the barrier layer 122 may include at least one inorganic insulating layer. The buffer layer 121 and the barrier layer 122 may protect the pixels PX from moisture permeating through the substrate 110, where the substrate 110 may be susceptible to moisture permeation. The material of the buffer layer 121 and the barrier layer 122 may be variously changed according to embodiments.

In various embodiments, the first thin film transistor TFT1, the second thin film transistor TFT2, and the capacitor Cst may be disposed on the surface of the substrate 110 including the buffer layer 121 and the barrier layer 122.

In various embodiments, the first transistor TFT1 may include the first active layer ACT1 and a first gate electrode G1. In various embodiments, the first transistor TFT1 may further include a first source electrode S1 and a first drain electrode D1 connected to the first active layer ACT1. In another embodiment, the first transistor TFT1 may not include the first source electrode S1 and/or the first drain electrode D1 that are provided additionally, but may include a source electrode and/or a drain electrode integrally formed with a source region and/or a drain region of the first active layer ACT1. A gate electrode may be on the first insulating layer INS1, and a first source electrode S1 and/or the first drain electrode D1 may be on the second insulating layer INS2.

In various embodiments, the second transistor TFT2 may include the second active layer ACT2 and a second gate electrode G2. In various embodiments, the second transistor TFT2 may further include a back-gate electrode BG. In various embodiments, the second transistor TFT2 may further include a second source electrode S2 and a second drain electrode D2 connected to the second active layer ACT2. In another embodiment, the second thin film transistor TFT2 may not include the second source electrode S2 and/or the second drain electrode D2 that are provided additionally, but may include a source electrode and/or a drain electrode integrally formed with a source region and/or a drain region of the second active layer ACT2.

In various embodiments, the capacitor Cst may include a first capacitor electrode CAE1 and a second capacitor electrode CAE2. The first capacitor electrode CAE1 and the second capacitor electrode CAE2 may overlap each other with at least one insulating layer interposed therebetween. The second gate insulating layer 124 may separate the first capacitor electrode CAE1 from the second capacitor electrode CAE2 to form the capacitor Cst.

In various embodiments, the first semiconductor layer SCL1 may be disposed on the buffer layer 121 and the barrier layer 122. The first semiconductor layer SCL1 may include the first active layer ACT1 of the first transistor TFT1. For example, the first semiconductor layer SCL1 may include the active layers of the first type transistors among the transistors constituting the pixel circuits of the pixels PX.

In various embodiments, the first active layer ACT1 may be provided on the first semiconductor layer SCL1 and may include a first semiconductor material (e.g., polysilicon). The first active layer ACT1 may include a channel region overlapping the first gate electrode G1, and the source region and the drain region positioned on opposite sides of the channel region. In an embodiment, the source region and the drain region of the first active layer ACT1 may be connected to the first source electrode S1 and the first drain electrode D1, respectively. In an embodiment, the source region and/or the drain regions of the first active layer ACT1 may be the source electrode and/or the drain electrode of the first transistor TFT1.

In various embodiments, the first gate insulating layer 123 may be disposed on the first semiconductor layer SCL1. The first gate insulating layer 123 may cover the first semiconductor layer SCL1.

In various embodiments, the first gate conductive layer GCDL1 may be disposed on the first gate insulating layer 123. The first gate conductive layer GCDL1 may include the first gate electrode G1 of the first transistor TFT1. The first gate electrode G1 may be provided in the first gate conductive layer GCDL1 to overlap a part (e.g., the channel region) of the first active layer ACT1.

In various embodiments, the first gate conductive layer GCDL1 may further include at least one wire (or a part of the at least one wire), a conductive pattern (e.g., a bridge pattern), and/or a capacitor electrode. For example, the first gate conductive layer GCDL1 may further include the first capacitor electrode CAE1 of the capacitor Cst.

In various embodiments, the second gate insulating layer 124 may be disposed on the first gate conductive layer GCDL1. The second gate insulating layer 124 may cover the first gate conductive layer GCDL1.

In various embodiments, the second gate conductive layer GCDL2 may be disposed on the second gate insulating layer 124. The second gate conductive layer GCDL2 may include one electrode of the capacitor Cst, for example, the second capacitor electrode CAE2. In various embodiments, the second gate conductive layer GCDL2 may further include at least one electrode, a wire (or a part of the at least one wire), and/or a conductive pattern (e.g., a bridge pattern). For example, the second gate conductive layer GCDL2 may further include the back-gate electrode BG connected to the second gate electrode G2 of the second transistor TFT2.

In various embodiments, the first interlayer insulating layer 125 may be disposed on the second gate conductive layer GCDL2. The first interlayer insulating layer 125 may cover the second gate conductive layer GCDL2.

In various embodiments, the second semiconductor layer SCL2 may be disposed on the first interlayer insulating layer 125. The second semiconductor layer SCL2 may include the second active layer ACT2 of the second transistor TFT2. For example, the second semiconductor layer SCL2 may include the active layers of the second type transistors among the transistors constituting the pixel circuits of pixels PX.

In various embodiments, the second active layer ACT2 may be provided on the second semiconductor layer SCL2 and may include a second semiconductor material (e.g., an oxide semiconductor) different from the first semiconductor material. For example, the second active layer ACT2 may include IGZO (indium (In), gallium (Ga), zinc (Zn) and oxygen (O)), IGZTO (indium (In), gallium (Ga), zinc (Zn), tin (Sn) and oxygen (O)), or IGTO (indium (In), gallium (Ga), tin (Sn), and oxygen (O)).

In various embodiments, the second active layer ACT2 may include a channel region overlapping the second gate electrode G2, and the source region and the drain region positioned on both sides of the channel region. In various embodiments, the source region and the drain region of the second active layer ACT2 may be connected to the second source electrode S2 and the second drain electrode D2, respectively. In another embodiment, the source region and/or the drain region of the second active layer ACT2 may be the source electrode and/or the drain electrode of the second transistor TFT2.

In various embodiments, the third gate insulating layer 126 may be disposed on the second semiconductor layer SCL2. The third gate insulating layer 126 may cover the second gate conductive layer GCDL2 and the second semiconductor layer SCL2.

The third gate conductive layer GCDL3 may be disposed on the third gate insulating layer 126. The third gate conductive layer GCDL3 may include the second gate electrode G2 of the second transistor TFT2. The second gate electrode G2 may be provided on the third gate conductive layer GCDL3 to overlap a part (e.g., a channel region) of the second active layer ACT2. In various embodiments, the third gate conductive layer GCDL3 may further include at least one wire (or a part of the at least one wire), a conductive pattern (e.g., a bridge pattern), and/or a capacitor electrode.

In various embodiments, each of the electrodes, the conductive patterns, and/or the wires provided on the first gate conductive layer GCDL1, the second gate conductive layer GCDL2, and the third gate conductive layer GCDL3 may include a conductive material (e.g., molybdenum (Mo), aluminum (Al), chromium (Cr), gold (Au), silver (Ag), titanium (Ti), nickel (Ni), neodymium (Nd), copper (Cu), and at least one of other metals, alloys thereof, or other conductive materials), and each may have a single layer or multi-layer structure. For example, each of the electrodes, the conductive patterns, and/or the wires provided in the first gate conductive layer GCDL1, the second gate conductive layer GCDL2, and the third gate conductive layer GCDL3 may include molybdenum (Mo) or other metal materials. At least two conductive layers among the first gate conductive layer GCDL1, the second gate conductive layer GCDL2, and the third gate conductive layer GCDL3 may include the same material or may include different materials. The materials of the first gate conductive layer GCDL1, the second gate conductive layer GCDL2, and the third gate conductive layer GCDL3 are not particularly limited, and may be modified in various ways according to embodiments.

In various embodiments, the second interlayer insulating layer 127 may be disposed on the third gate conductive layer GCDL3. The second interlayer insulating layer 127 may cover the third gate conductive layer GCDL3.

In various embodiments, the first gate insulating layer 123, the second gate insulating layer 124, the first interlayer insulating layer 125, the third gate insulating layer 126, and the second interlayer insulating layer 127 may be inorganic insulating layers including an inorganic insulating material (e.g., silicon nitride, silicon oxide, silicon oxynitride, titanium oxide, aluminum oxide, or other inorganic insulating materials), and each of them may have a single-layer or multi-layer structure. At least two of the first gate insulating layer 123, the second gate insulating layer 124, the first interlayer insulating layer 125, the third gate insulating layer 126, and the second interlayer insulating layer 127 may include the same material or different materials. The materials of the first gate insulating layer 123, the second gate insulating layer 124, the first interlayer insulating layer 125, the third gate insulating layer 126 and the second interlayer insulating layer 127 are not particularly limited, and may be modified in various ways according to embodiments.

In various embodiments, the first source-drain conductive layer SCDL1 may be disposed on the second interlayer insulating layer 127. The first source-drain conductive layer SCDL1 may include the first source electrode S1 and the first drain electrode D1 of the first transistor TFT1 (or at least one bridge pattern connected to the first source electrode S1 and/or the first drain electrode D1 of the first transistor TFT1), and the second source electrode S2 and the second drain electrode D2 of the second transistor TFT2 (or at least one bridge pattern connected to the second source electrode S2 and/or the second drain electrode D2 of the second transistor TFT2).

In various embodiments, the first source electrode S1 may be electrically connected to the source region of the first active layer ACT1. For example, the first source electrode S1 may be provided in the first source-drain conductive layer SCDL1, and may be electrically connected to the source region of the first active layer ACT1 through a contact hole penetrating the first gate insulating layer 123, the second gate insulating layer 124, the first interlayer insulating layer 125, the third gate insulating layer 126, and the second interlayer insulating layer 127.

In various embodiments, the first drain electrode D1 may be electrically connected to the drain region of the first active layer ACT1. For example, the first drain electrode D1 may be provided in the first source-drain conductive layer SCDL1, and may be electrically connected to the drain region of the first active layer ACT1 through a contact hole penetrating the first gate insulating layer 123, the second gate insulating layer 124, the first interlayer insulating layer 125, the third gate insulating layer 126, and the second interlayer insulating layer 127.

In various embodiments, the second source electrode S2 may be electrically connected to the source region of the second active layer ACT2. For example, the second source electrode S2 may be provided in the first source-drain conductive layer SCDL1, and may be electrically connected to the source region of the second active layer ACT2 through a contact hole penetrating the third gate insulating layer 126 and the second interlayer insulating layer 127.

In various embodiments, the second drain electrode D2 may be electrically connected to the drain region of the second active layer ACT2. For example, the second drain electrode D2 may be provided in the first source-drain conductive layer SCDL1, and may be electrically connected to the drain region of the second active layer ACT2 through a contact hole penetrating the third gate insulating layer 126 and the second interlayer insulating layer 127.

In various embodiments, the first source-drain conductive layer SCDL1 may further include at least one wire (or a part of the at least one wire) and/or a conductive pattern (e.g., a bridge pattern). For example, the first source-drain conductive layer SCDL1 may further include data lines and/or at least one power line.

In various embodiments, the first planarization layer 128 may be disposed on the first source-drain conductive layer SCDL1, where the first planarization layer 128 may cover the second interlayer insulating layer 127 and at least portions of the first source electrode S1, first drain electrode D1, second source electrode S2, and second drain electrode D2. The first planarization layer 128 may cover the first source-drain conductive layer SCDL1.

In various embodiments, the second source-drain conductive layer SCDL2 may be disposed on the first planarization layer 128. The second source-drain conductive layer SCDL2 may include the connection electrode CNE. The connection electrode CNE may be provided in the second source-drain conductive layer SCDL2, and may be connected to the first drain electrode D1 of the first transistor TFT1 through a contact hole or a via hole penetrating the first planarization layer 128. In various embodiments, the second source-drain conductive layer SCDL2 may further include at least one wire (or a part of the at least one wire) and/or a conductive pattern (e.g., a bridge pattern). As an example, the second source-drain conductive layer SCDL2 may further include at least one power line.

In various embodiments, each of the electrodes, the conductive patterns, and/or the wires provided on the first source-drain conductive layer SCDL1 and the second source-drain conductive layer SCDL2 may include a conductive material (e.g., molybdenum (Mo), aluminum (Al), chromium (Cr), gold (Au), silver (Ag), titanium (Ti), nickel (Ni), neodymium (Nd), copper (Cu), and at least one of other metals, alloys thereof, or other conductive materials), and may have a single layer or multi-layer structure. As an example, each of the electrodes, the conductive patterns, and/or the wires provided in the first source-drain conductive layer SCDL1 and the second source-drain conductive layer SCDL2 may be formed in a triple-layer structure of titanium (Ti)/aluminum (Al)/titanium (Ti). The first source-drain conductive layer SCDL1 and the second source-drain conductive layer SCDL2 may contain the same material or different materials. The material and/or structure of each of the first source-drain conductive layer SCDL1 and the second source-drain conductive layer SCDL2 may be modified in various ways according to embodiments.

In various embodiments, the second planarization layer 129 may be disposed on the second source-drain conductive layer SCDL2, where the second planarization layer 129 may cover the first planarization layer 128. The second planarization layer 129 may cover the second source-drain conductive layer SCDL2.

In various embodiments, the first planarization layer 128 and the second planarization layer 129 may each be an organic insulating layer including an organic insulating material (e.g., acrylic resin, epoxy resin, phenolic resin, polyamide resin, polyimide resin, or other organic insulating material) to planarize the circuit layer 120, and each may have a single layer or multi-layer structure. The first planarization layer 128 and the second planarization layer 129 may include the same material or may include different materials. The materials of the first planarization layer 128 and the second planarization layer 129 are not particularly limited, and may be modified in various ways according to embodiments.

In various embodiments, the light emitting element layer 130 may be disposed on the circuit layer 120 and may be positioned in the display area DA, where for example, the light emitting element layer 130 may be disposed on the circuit layer 120 in the display area DA.

In various embodiments, the light emitting element layer 130 may include the light emitting elements EL of the pixels PX. For example, the light emitting element layer 130 may include a pixel defining layer 131 (also referred to as "bank") that separates emission areas EA of the respective pixels PX and the light emitting elements EL located in the respective emission areas EA. In various embodiments, the light emitting element layer 130 may further include a spacer 132 disposed on a part of the pixel defining layer 131.

Each of the light emitting elements EL may include a first electrode ET1 (e.g., an anode electrode), a light emitting layer EML, and a second electrode ET2 (e.g., a cathode electrode) sequentially disposed on the first electrode ET1. The first electrode ET1 (e.g., an anode electrode) may be connected to at least one transistor (e.g., the first transistor TFT1) included in the corresponding pixel PX through at least one connection electrode CNE. In various embodiments, the light emitting element EL may further include a first intermediate layer (e.g., hole layer including a hole transport layer) interposed between the first electrode ET1 and the light emitting layer EML, and a second intermediate layer (e.g., an electron layer including an electron transport layer) interposed between the light emitting layer EML and the second electrode ET2.

In various embodiments, the first electrode ET1 of the light emitting element EL may be disposed on the circuit layer 120, where for example, the first electrode ET1 may be disposed on the second planarization layer 129 to correspond to each emission area EA. The first electrode ET1 may be connected to the connection electrode CNE through a contact hole or a via hole penetrating the second planarization layer 129. The pixel defining layer 131 may cover at least a portion of the first electrode ET1, where the first electrode ET1 may extend beneath the pixel defining layer 131.

In various embodiments, the first electrode ET1 may include a conductive material. In various embodiments, the first electrode ET1 may include a metal material having high reflectivity. For example, the first electrode ET1 may have a single-layer structure of molybdenum (Mo), titanium (Ti), copper (Cu) or aluminum (Al), or may have a multi-layer structure (e.g., ITO/Mg, ITO/MgF, ITO/Ag, and ITO/Ag/ITO) including indium-tin-oxide (ITO), indium-zinc-oxide (IZO), zinc oxide (ZnO), indium oxide ($In_2O_3$) and silver (Ag), magnesium (Mg), aluminum (Al), platinum (Pt), lead (Pb), gold (Au), or nickel (Ni).

In various embodiments, the light emitting layer EML of the light emitting element EL may include a high-molecular-weight material or a low-molecular-weight material. Light emitted from the light emitting layer EML may contribute to the image displayed. In various embodiments, the light emitting layer EML may be provided for each pixel PX, and the light emitting layer EML of each pixel PX may emit visible light of a color corresponding to the corresponding pixel PX. In another embodiment, the light emitting layer EML may be a common layer shared by pixels PX of different colors, and a wavelength conversion layer and/or color filters corresponding to the color (or wavelength band) of light desired to be emitted from each pixel PX may be arranged in the emission areas EA of at least some of the pixels PX.

In various embodiments, the second electrode ET2 of the light emitting element EL may include a conductive material. In various embodiments, the second electrode ET2 may be a common layer formed across the entire display area DA to cover the light emitting layer EML and the pixel defining layer 131. In various embodiments, the second electrode ET2 may be formed of a transparent conductive material (TCO), such as ITO or IZO that is capable of transmitting light or a semi-transmissive conductive material such as magnesium (Mg), silver (Ag), or an alloy of magnesium (Mg) and silver (Ag).

In various embodiments, the pixel defining layer 131 may have an opening corresponding to each of the emission areas EA and may surround the emission areas EA. For example, the pixel defining layer 131 may be formed to cover an edge of the first electrode ET1 of the light emitting element EL and may include an opening exposing the remaining portion of the first electrode ET1. A region where the exposed first electrode ET1 and the light emitting layer EML overlap (or a region including the same) may be defined as the emission area EA of each pixel PX. The openings in the pixel defining layer 131 may be located at predetermined positions in the display area DA.

In various embodiments, the pixel defining layer 131 may include at least one organic insulating layer containing an organic insulating material. For example, the pixel defining layer 131 may include acrylic resin, epoxy resin, phenolic resin, polyamide resin, polyimide resin, unsaturated polyester resin, polyphenylene ether resin, polyphenylenesulfide resin, benzocyclobutene (BCB), or other organic insulating materials.

In various embodiments, the spacer 132 may be disposed on a part of the pixel defining layer 131. The spacer 132 may include at least one organic insulating layer containing an organic insulating material. The spacer 132 may include the same material as the pixel defining layer 131 or may include a different material from the pixel defining layer 131. In various embodiments, the pixel defining layer 131 and the spacer 132 may be sequentially formed through separate mask processes. In another embodiment, the pixel defining layer 131 and the spacer 132 may be simultaneously formed using a halftone mask. In this case, the pixel defining layer 131 and the spacer 132 may be regarded as a single insulating layer that is integral with each other. The encapsulation layer 140 may extend over and cover the spacer 132.

In various embodiments, the encapsulation layer 140 may be disposed on the light emitting element layer 130. The encapsulation layer 140 may cover the light emitting element layer 130 in the display area DA and may extend to the non-display area NA, where the encapsulation layer 140 may be in contact with the circuit layer 120. For example, the encapsulation layer 140 may be disposed in the display area DA to cover the light emitting element layer 130, and the edge of the encapsulation layer 140 may be located in a portion of the non-display area NA adjacent to the display area DA. The encapsulation layer 140 may block the permeation of oxygen or moisture into the light emitting element layer 130, and may reduce electrical and/or physical impacts to the circuit layer 120 and the light emitting element layer 130.

In various embodiments, the encapsulation layer 140 may have a multi-layer structure, including a first encapsulation layer 141, a second encapsulation layer 142, and a third encapsulation layer 143 sequentially disposed on the light emitting element layer 130. The first encapsulation layer 141 and the third encapsulation layer 143 may be inorganic encapsulation layers containing an inorganic material, and the second encapsulation layer 142 may be an organic encapsulation layer containing an organic material. The first encapsulation layer 141 may cover the second electrode ET2 and spacer 132.

In various embodiments, the display panel 100 may include at least one dam for limiting the diffusion range of the organic material of the second encapsulation layer 142. For example, the display panel 100 may include a dam surrounding the display area DA.

In various embodiments, the sensor layer 150 may be disposed on the encapsulation layer 140 in the display area DA. In various embodiments, the sensor layer 150 may include a first sensor conductive layer TCDL1 and a second sensor conductive layer TCDL2. In addition, the sensor layer 150 may include a first sensor insulating layer 151, a second sensor insulating layer 152, and a passivation layer 153 sequentially disposed on the encapsulation layer 140.

In various embodiments, the first sensor insulating layer 151 may be disposed on the encapsulation layer 140, where the first sensor insulating layer 151 may cover the third encapsulation layer 143. The first sensor insulating layer 151 may include at least one inorganic insulating layer containing an inorganic insulating material. The first sensor insulating layer 151 may cover the encapsulation layer 140 to protect the encapsulation layer 140 and prevent moisture permeation.

In various embodiments, the first sensor conductive layer TCDL1 may be disposed on the first sensor insulating layer 151. In various embodiments, the first sensor conductive layer TCDL1 may include first sensor electrodes TS1 and/or bridge patterns BRP of second sensor electrodes TS2. In an embodiment, the first sensor conductive layer TCDL1 may include first sensor electrodes TS1 and/or the second sensor electrodes TS2.

In various embodiments, the second sensor insulating layer 152 may be disposed on the first sensor conductive layer TCDL1, where the second sensor insulating layer 152 may cover the first sensor conductive layer TCDL1. The second sensor insulating layer 152 may include at least one inorganic insulating layer containing an inorganic insulating material.

In various embodiments, the second sensor conductive layer TCDL2 may be disposed on the second sensor insulating layer 152. In various embodiments, the second sensor conductive layer TCDL2 may include the first sensor electrodes TS1 and/or the second sensor electrodes TS2. In an embodiment, the second sensor conductive layer TCDL2 may include the first sensor electrodes TS1 and/or the bridge patterns BRP of the second sensor electrodes TS2.

Each of the electrodes, the conductive patterns, and/or the wires provided on the first sensor conductive layer TCDL1 and the second sensor conductive layer TCDL2 may include a conductive material (e.g., molybdenum (Mo), aluminum (Al), chromium (Cr), gold (Au), silver (Ag), titanium (Ti), nickel (Ni), neodymium (Nd), copper (Cu), and at least one of other metals, alloys thereof, transparent conductive materials such as ITO and IZO, or other conductive materials). Each of the electrodes, the conductive patterns, and/or the wires provided in the first sensor conductive layer TCDL1 and the second sensor conductive layer TCDL2 may have a single-layer or multi-layer structure.

In various embodiments, the first sensor conductive layer TCDL1 and/or the second sensor conductive layer TCDL2 may include mesh-shaped conductive patterns. For example, the first sensor electrodes TS1, the second sensor electrodes TS2, and the bridge patterns BRP may be formed of mesh-shaped patterns including openings corresponding to the emission areas EA of the pixels PX. Accordingly, the light loss of the display panel 100 may be prevented or reduced, and the light efficiency may be increased.

In various embodiments, the passivation layer 153 may be disposed on the second sensor conductive layer TCDL2, and may cover the second sensor insulating layer 152. The passivation layer 153 may include at least one insulating layer containing an inorganic insulating material and/or an organic insulating material. The passivation layer 153 may be made of an organic insulating material (e.g., a negative photoresist material), that may be formed through a low-temperature process, but the material of the passivation layer 153 is not limited thereto.

In various embodiments, the sensor layer 150 may further include wires connected to the first sensor electrodes TS1 and the second sensor electrodes TS2. For example, the sensor layer 150 may further include sensor lines that are connected to the first sensor electrodes TS1 and the second sensor electrodes TS2 within the display area DA and/or around the display area DA and pass through the non-display area NA.

In various embodiments, the sensor layer 150 may be formed integrally with the display panel 100. For example, the first sensor electrodes TS1, the second sensor electrodes TS2, and portions of the sensor lines may be formed on the encapsulation layer 140, and disposed above the pixels PX formed in the circuit layer 120 and the light emitting element layer 130, and other portions of the sensor lines may be formed on the substrate 110 and/or the circuit layer 120.

A touch input or the like occurring in the display area DA may be sensed by the touch sensor including the first sensor electrodes TS1 and the second sensor electrodes TS2. For example, the first sensor electrodes TS1 and the second sensor electrodes TS2 may be touch electrodes for detecting a user's touch or approach.

In various embodiments, the display device 10 may further include an additional element disposed on the sensor layer 150. For example, the display device 10 may further include at least one of an optical layer (e.g., an anti-reflection layer including a polarization layer and/or a color filter layer) or a passivation layer (e.g., a window or a protective film) disposed on the sensor layer 150. The optical layer and/or the passivation layer may be provided on the display panel 100, where for example, the optical layer and/or the passivation layer may be formed on the sensor layer 150, and may be manufactured integrally with the display panel 100. In another embodiment, the optical layer and/or the passivation layer may be manufactured separately from the display panel 100 and attached to the display panel 100 via an adhesive layer or the like.

Figure 4:
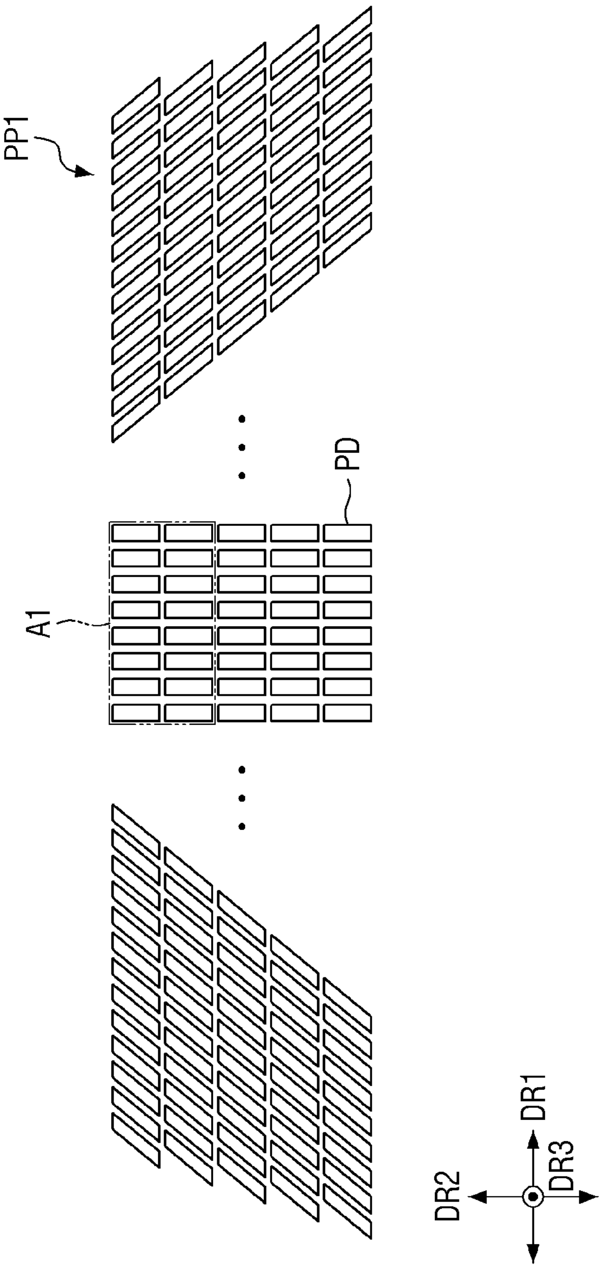
FIG. 4 is a plan view illustrating pads of a first pad area according to an embodiment.

FIG. 4 is a plan view illustrating pads PD of the first pad area PP1 according to an embodiment. For example, FIG. 4 shows an example of the pads PD located in the first pad area PP1 and connected to the output terminals of the driving circuit 200.

Referring to FIG. 4 in addition to FIGS. 1 and 2, the multiple number of pads PD may be arranged in the first pad area PP1 to which the driving circuit 200 is electrically connected. The pads PD may include pads for transmitting signals (e.g., image data and related signals, power, etc.) to the driving circuit 200, and pads for receiving signals (e.g., data signals, gate driver control signals, etc.) outputted from the driving circuit 200, where the pads can be electrically conductive. The illustrated pads PD may be pads connected to the output terminals of the driving circuit 200 to receive the signals outputted from the driving circuit 200. A plurality of the pads PD may be electrically connected to data lines located in the display area DA, and may receive data signals (e.g., respective data voltages) applied to the pixels PX from the driving circuit 200 through the data lines. For electrical connection between signal lines such as the data lines and the pads PD, wires connected to the pads PD may be located between the first pad area PP1 and the display area DA.

Because the Plurality of pads PD (e.g., thousands of pads) may be disposed in the first pad area PP1 to meet the trend of high resolution of the display device, the pads PD may be arranged in multiple columns. In each column, the pads PD may be disposed at a preset intervals along the first direction DR1.

In various embodiments, each pad PD may have, in plan view, a rectangular shape. The pad PD may have a long side (length) and a short side (width). The short side of the pad PD may be parallel to the first direction DR1. The long sides of the pads PD located in the left and right regions in the first pad area PP1 may be inclined with respect to the first direction DR1 and the second direction DR2. For example, in the first pad area PP1, the pads PD located in the center region may have, in plan view, a rectangular shape, and the pads PD located in the left and right regions may have, in plan view, a parallelogram shape. The lengths of the long side and the short side of the pad PD may be approximately the same, and the pad PD may have various other shapes in plan view.

FIG. 5 is a plan view illustrating a pad area of the display panel 100 according to an embodiment. For example, FIG. 5 schematically illustrates a portion of the first pad area PP1 corresponding to area A1 of FIG. 4.

Figure 6:
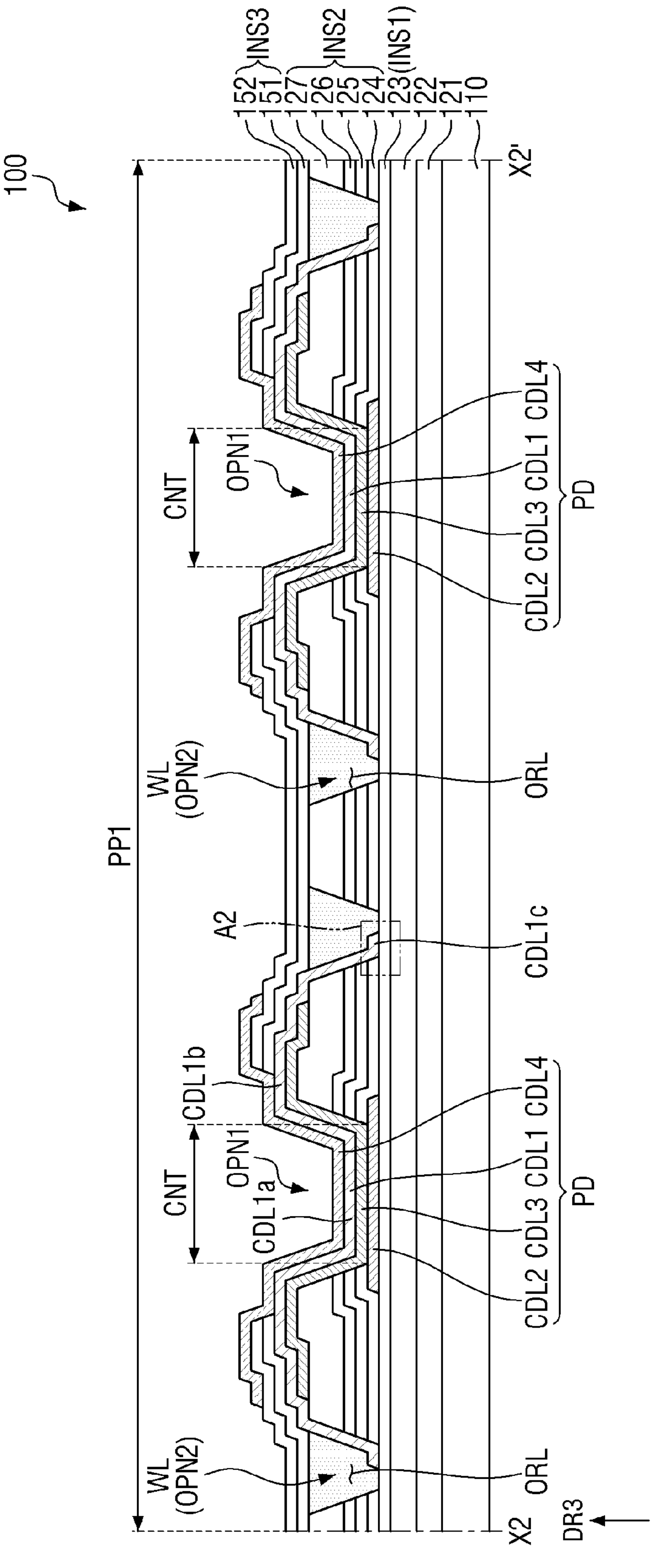
FIG. 6 is a cross-sectional view illustrating the pad area of the display panel according to an embodiment.

FIG. 6 is a cross-sectional view illustrating the pad area of the display panel 100 according to an embodiment. For example, FIG. 6 illustrates an example of a cross section of a portion of the first pad area PP1 corresponding to line X2-X2' of FIG. 5. The remaining portion of the first pad area PP1 (for example, the portion where the pads PD having inclined long sides are located) may also have a structure substantially the same as or similar to the portion of the first pad area PP1 illustrated in FIGS. 5 and 6.

Figure 7:
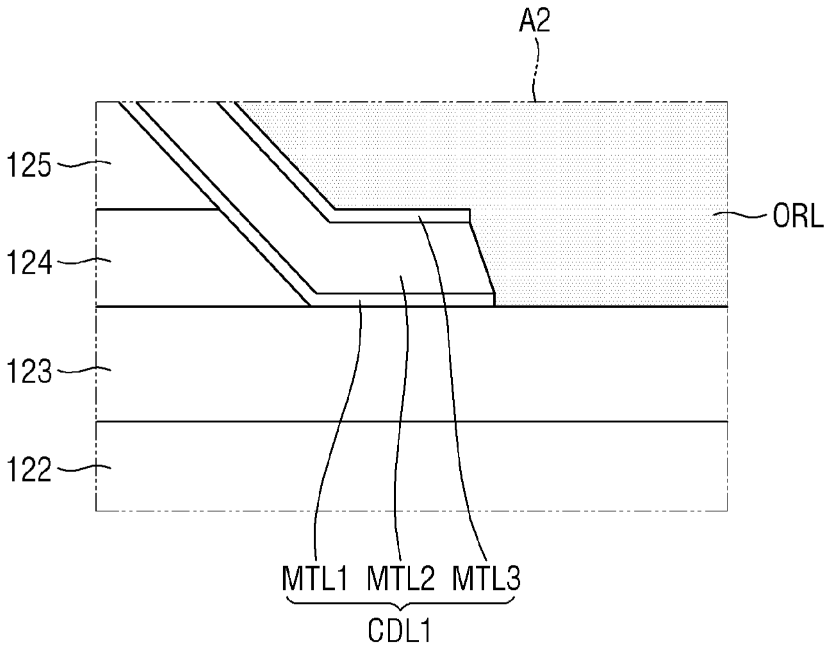
FIG. 7 is an enlarged cross-sectional view of area A2 of FIG. 6.

FIG. 7 is an enlarged cross-sectional view of area A2 of FIG. 6. For example, FIG. 7 illustrates an example of a cross section of a first conductive layer CDL1.

Referring to FIGS. 5 to 7 in addition to FIGS. 1 to 4, the display panel 100 may include contact portions CNT where the respective pads PD located in the first pad area PP1 are connected to the driving circuit 200. For example, the first pad area PP1 may include the contact portions CNT at positions corresponding to the pads PD, and the pads PD may be exposed in the corresponding contact portions CNT to be electrically connected to the driving circuit 200.

In various embodiments, the display panel 100 may include at least one conductive layer constituting the pads PD located in the first pad area PP1, and at least one insulating layer disposed around the at least one conductive layer, where the insulating layer may electrically isolate each of the pads PD from the other pads PD. For example, each pad PD may include the first conductive layer CDL1, and a first insulating layer INS1 and a second insulating layer INS2 may be disposed under and/or around the first conductive layer CDL1. A third insulating layer INS3 may be disposed above and/or around the first conductive layer CDL1. The first insulating layer INS1, the second insulating layer INS2, and the third insulating layer INS3 may be sequentially disposed on the substrate 110. Each of the first insulating layer INS1, the second insulating layer INS2, and the third insulating layer INS3 may have a single-layer or multi-layer structure.

Each pad PD may have a single-layer or multi-layer structure including the first conductive layer CDL1. In various embodiments, each pad PD may have a quad-layer structure including, in addition to the first conductive layer CDL1, a second conductive layer CDL2 disposed under the first conductive layer CDL1, a third conductive layer CDL3 disposed between the first conductive layer CDL1 and the second conductive layer CDL2, and a fourth conductive layer CDL4 disposed on the first conductive layer CDL1. However, it should be noted that embodiments are not limited thereto, and the structure of the pad PD may be modified in various ways. For example, the pad PD may not include at least one of the second conductive layer CDL2, the third conductive layer CDL3, or the fourth conductive layer CDL4.

In various embodiments, the first conductive layer CDL1 may be disposed on the same layer as the second source-drain conductive layer SCDL2 of the display area DA, and may be formed simultaneously with the electrodes, the conductive patterns, and/or the wires provided in the second source-drain conductive layer SCDL2 by using the same materials as them. For example, the first conductive layer CDL1 may include the same conductive material as the connection electrode CNE of each pixel PX and may be disposed on the same layer as the connection electrode CNE. In addition, the first conductive layer CDL1 may have substantially the same cross-sectional structure as the connection electrode CNE of each pixel PX.

In various embodiments, the first conductive layer CDL1 may have a multi-layer structure including a first metal layer MTL1, a second metal layer MTL2 disposed on the first metal layer MTL1, and a third metal layer MTL3 disposed on the second metal layer MTL2, as illustrated in FIG. 7. In various embodiments, the first metal layer MTL1 and the third metal layer MTL3 may include a first metal, and the second metal layer MTL2 may include a second metal different from the first metal. The second metal layer MTL2 may be sandwiched between the first metal layer MTL1 and the third metal layer MTL3, such that the second metal layer MTL2 does not have a large exposed surface.

In various embodiments, the second metal layer MTL2 may be formed of aluminum Al or the like having a relatively low resistance. In addition, each of the first metal layer MTL1 and the third metal layer MTL3 may be formed of titanium (Ti) or the like capable of blocking ions of the second metal layer MTL2 from diffusing to the adjoining regions. For example, the first conductive layer CDL1 may have a triple-layer structure of titanium (Ti)/aluminum (Al)/titanium (Ti). Accordingly, the conductivity and the stability of the first conductive layer CDL1 may be secured. The material and/or structure of the first conductive layer CDL1 may not be particularly limited, and may be modified in various ways according to embodiments.

In various embodiments, the second metal layer MTL2 can provide a media for transmitting an electrical signal, and may have a relatively large thickness, as compared to the thickness of first metal layer MTL1 and/or the third metal layer MTL3. The first metal layer MTL1 and the third metal layer MTL3 may function as capping layers that prevent or block a reactive material from reaching the second metal layer MTL2 under and above the first conductive layer CDL1. The first metal layer MTL1, the second metal layer MTL2, and the third metal layer MTL3 may be collectively etched and patterned through a single mask process.

In various embodiments, the second conductive layer CDL2 may be disposed on the same layer as the first gate conductive layer GCDL1 of the display area DA, and may be simultaneously formed with the electrodes, the conductive patterns, and/or the wires provided in the first gate conductive layer GCDL1 by using the same materials as the electrodes, the conductive patterns, and/or the wires. For example, the second conductive layer CDL2 may include the same conductive material as the first gate electrode G1 of the first transistor TFT1, and may be disposed on the same layer as the first gate electrode G1.

In various embodiments, the third conductive layer CDL3 may be disposed on the same layer as the first source-drain conductive layer SCDL1 of the display area DA, and may be simultaneously formed with the electrodes, the conductive patterns, and/or the wires provided in the first source-drain conductive layer SCDL1 by using the same materials as them. For example, the third conductive layer CDL3 may include the same conductive material as the first source electrode S1 and/or the first drain electrode D1 of the first transistor TFT1, and/or the second source electrode S2 and/or the second drain electrode D2 of the second transistor TFT2, and may be disposed on the same layer as these electrodes. In addition, the third conductive layer CDL3 may have substantially the same cross-sectional structure as the first source electrode S1 and/or the first drain electrode D1 of the first transistor TFT1, and/or the second source electrode S2 and/or the second drain electrode D2 of the second transistor TFT2.

In various embodiments, the fourth conductive layer CDL4 may be disposed on the same layer as the second sensor conductive layer TCDL2 of the display area DA, and may be formed simultaneously with the electrodes, the conductive patterns, and/or the wires provided in the second sensor conductive layer TCDL2 by using the same materials as them. For example, the fourth conductive layer CDL4 may include the same conductive material as the first sensor electrodes TS1 and/or the second sensor electrodes TS2, and may be disposed on the same layer as the first sensor electrodes TS1 and/or the second sensor electrodes TS2.

In various embodiments, the conductive layers constituting each pad PD may be electrically connected to each other. For example, the first conductive layer CDL1, the second conductive layer CDL2, the third conductive layer CDL3, and the fourth conductive layer CDL4 constituting each pad PD can be sequentially disposed in the contact portion CNT along the third direction DR3, and may be electrically connected to each other. As an example, the second insulating layer INS2 and the third insulating layer INS3 may be opened in the contact portion CNT, and the first conductive layer CDL1, the second conductive layer CDL2, the third conductive layer CDL3, and the fourth conductive layer CDL4 may be sequentially stacked in the contact portion CNT with no insulating layer interposed therebetween.

In various embodiments, the buffer layer 121 and/or the barrier layer 122 may be disposed on the substrate 110. The first insulating layer INS1 may be disposed on one surface of the substrate 110 on which the buffer layer 121 and/or the barrier layer 122 are disposed.

In various embodiments, the first insulating layer INS1 may refer to one or more insulating layers disposed under the pads PD. For example, the first insulating layer INS1 may be a single-layered or multi-layered insulating layer including the first gate insulating layer 123. In various embodiments, the first insulating layer INS1 may be the same as first gate insulating layer 123. In another embodiment, the first insulating layer INS1 may include the first gate insulating layer 123, and may further include at least one of the buffer layer 121 or the barrier layer 122. In another embodiment, the display panel 100 does not include the first gate insulating layer 123, but the first insulating layer INS1 does include at least one of the buffer layer 121 or the barrier layer 122. FIG. 6 illustrates an embodiment in which the first insulating layer INS1 is the first gate insulating layer 123.

In various embodiments, the second insulating layer INS2 may be disposed on the first insulating layer INS1. The second insulating layer INS2 may refer to one or more insulating layers disposed under the first conductive layer CDL1. For example, the second insulating layer INS2 may include one or more inorganic insulating layers disposed between the first gate conductive layer GCDL1 provided with the second conductive layer CDL2 and the second source-drain conductive layer SCDL2 provided with the first conductive layer CDL1. The second insulating layer INS2 may be a single-layered or multi-layered insulating layer, including at least one of the second gate insulating layer 124, the first interlayer insulating layer 125, the third gate insulating layer 126, or the second interlayer insulating layer 127. FIG. 6 illustrates an embodiment in which the second insulating layer INS2 includes the second gate insulating layer 124, the first interlayer insulating layer 125, the third gate insulating layer 126, and the second interlayer insulating layer 127.

In various embodiments, the third insulating layer INS3 may be disposed on the second insulating layer INS2. The third insulating layer INS3 may refer to one or more insulating layers disposed above the first conductive layer CDL1. For example, the third insulating layer INS3 may include one or more inorganic insulating layers disposed above the first conductive layer CDL1. In various embodiments, the third insulating layer INS3 may include at least one insulating layer disposed between the pixels PX and the sensor electrodes (the first sensor electrodes TS1 and/or the second sensor electrodes TS2). The third insulating layer INS3 may be a single-layered or multi-layered insulating layer, including at least one of the first sensor insulating layer 151 or the second sensor insulating layer 152. FIG. 6 illustrates an embodiment in which the third insulating layer INS3 includes the first sensor insulating layer 151 and the second sensor insulating layer 152.

In various embodiments, the second insulating layer INS2 and the third insulating layer INS3 may be opened to expose the pad PD in each contact portion CNT. For example, each of the second insulating layer INS2 and the third insulating layer INS3 may include a first opening OPN1 located adjacent to the contact portion CNT of the pad area.

In various embodiments, the second conductive layer CDL2 may be exposed through the first opening OPN1 of the second insulating layer INS2 in the contact portion CNT. The second conductive layer CDL2 may be covered with the second insulating layer INS2 around the contact portion CNT, where for example, the second insulating layer INS2 may cover an edge region of the second conductive layer CDL2. The second conductive layer CDL2 may be between the first insulating layer INS1 and the third conductive layer CDL3.

In various embodiments, the third conductive layer CDL3 may be disposed on the second conductive layer CDL2 exposed by the first opening OPN1 in the contact portion CNT. The third conductive layer CDL3 may be disposed between the first conductive layer CDL1 and the second conductive layer CDL2, and may be disposed in the first opening OPN1 in the contact portion CNT. The third conductive layer CDL3 may be disposed on the second insulating layer INS2 and covered by the first conductive layer CDL1 around the contact portion CNT. For example, the first conductive layer CDL1 (e.g., a second conductive layer portion CDL1*b* of the first conductive layer CDL1) may completely cover the edge region of the third conductive layer CDL3.

In various embodiments, the first conductive layer CDL1 may extend away from the contact portion CNT to a greater extent than the third conductive layer CDL3, where the first conductive layer CDL1 may cover the edges of the third conductive layer CDL3. For example, the first conductive layer CDL1 may extend into a well portion WL formed in the second insulating layer INS2, and an end of the first conductive layer CDL1 may be disposed in the well portion WL.

In the embodiments, the second insulating layer INS2 may include the well portion WL (also referred to as a "recess" or "groove") surrounding each contact portion CNT. In various embodiments, the well portion WL may be formed by opening at least one insulating layer constituting the second insulating layer INS2. The second insulating layer INS2 may include a second opening OPN2 exposing the first insulating layer INS1 through etching the well portion WL. For example, the second gate insulating layer 124, the first interlayer insulating layer 125, the third gate insulating layer 126, and the second interlayer insulating layer 127 constituting the second insulating layer INS2 may include the second opening OPN2 in the well portion WL.

In various embodiments, the pad PD may be located at least in the contact portion CNT, and an end of the pad PD (e.g., the end of the first conductive layer CDL1) may be located around the contact portion CNT. For example, the pad PD may be disposed on the first insulating layer INS1 in the contact portion CNT and around the contact portion CNT. A part of the pad PD may be disposed on the second insulating layer INS2 around the contact portion CNT.

In various embodiments, the first conductive layer CDL1 of each pad PD may be located in the well portion WL formed in the second insulating layer INS2 around the contact portion CNT of the corresponding pad PD. The end of the first conductive layer CDL1 may be located on a bottom surface of the well portion WL. In various embodiments, when the second insulating layer INS2 is etched in the well portion WL by the entire thickness thereof to expose the first insulating layer INS1, the first insulating layer INS1 may form the well portion WL together with the unetched portions of the second insulating layer INS2. The first insulating layer INS1 exposed in the well portion WL may form the bottom surface of the well portion WL, and the end of the first conductive layer CDL1 may be disposed on the first insulating layer INS1 in the well portion WL.

In various embodiments, the first conductive layer CDL1 of each pad PD may include a first conductive layer portion CDL1*a* that is disposed in the first opening OPN1 formed in the second insulating layer INS2 in the contact portion CNT, a second conductive layer portion CDL1*b* that extends from the first conductive layer portion CDL1*a* to the outside of the contact portion CNT, and a third conductive layer portion CDL1*c* that extends from the second conductive layer portion CDL1*b* into the well portion WL and includes the end of the first conductive layer CDL1. The first conductive layer CDL1 may extend from the contact portion CNT to the well portion WL via an upper portion of the second insulating layer INS2. For example, the second conductive layer portion CDL1*b* of the first conductive layer CDL1 may be disposed on the second insulating layer INS2.

In the various embodiments, an organic layer ORL may be disposed in the well portion WL formed in the second insulating layer INS2. The organic layer ORL may cover at least a part of the first conductive layer CDL1 located in the well portion WL, including the end of the first conductive layer CDL1. For example, the organic layer ORL may cover the third conductive layer portion CDL1*c* of the first conductive layer CDL1.

In various embodiments, the organic layer ORL may cover the end of the first conductive layer CDL1. Accordingly, during a subsequent process performed after the formation of the first conductive layer CDL1 in the manufacturing process of the display panel 100, it is possible to prevent defects that may be caused by the end of the first conductive layer CDL1 being damaged or etched in an unintended form. For example, when performing an etching process for forming other patterns after forming the first conductive layer CDL1, in a state where the first conductive layer CDL1 is exposed without cladding the end of the first conductive layer CDL1 with the organic layer ORL, the second metal layer MTL2 of the first conductive layer CDL1 is overetched compared to the first metal layer MTL1 and/or the third metal layer MTL3, so that an undercut phenomenon may occur or be severe in the lower part of the third metal layer MTL3. Accordingly, the end of the third metal layer MTL3 may be broken, resulting in defects in the form of particles, or a void may be generated under the end of the third metal layer MTL3, thereby causing moisture permeation or a crack. On the other hand, according to the embodiments, by cladding the end of the first conductive layer CDL1 with the organic layer ORL, it is possible to prevent defects that may be caused by the end of the first conductive layer CDL1 being damaged or further etched in an unintended form (e.g., the second conductive layer MTL2 being overetched).

In various embodiments, the organic layer ORL may include the same material as at least one organic insulating layer disposed on the second source-drain conductive layer SCDL2 in the display area DA, or may be formed simultaneously with the organic insulating layer. For example, the organic layer ORL may include the same organic insulating material as the second planarization layer 129, or may be formed simultaneously with the second planarization layer 129. Accordingly, the manufacturing efficiency of the display panel 100 may be increased.

The organic layer ORL may reduce or planarize a step formed in the second insulating layer INS2 or the like due to the well portion WL. In various embodiments, the organic layer ORL may have a height equal to or less than the height of the second insulating layer INS2. Accordingly, it is possible to prevent the organic layer ORL from protruding upward from the second insulating layer INS2 and to increase flatness around the contact portion CNT.

In various embodiments, the organic layer ORL may be formed to have substantially the same height as the second insulating layer INS2 at the boundary of the well portion WL and may have a substantially flat top surface. For example, the organic layer ORL has a height (or thickness) corresponding to the depth of the well portion WL and may completely fill the well portion WL. Accordingly, while cladding the end of the first conductive layer CDL1 with the organic layer ORL around the contact portion CNT, the occurrence of a step may be prevented or reduced by the organic layer ORL.

In the various embodiments, the organic layer ORL may have a shape surrounding the contact portion CNT to completely and/or stably cover the end of the first conductive layer CDL1 in plan view. For example, by forming the second opening OPN2 (or a groove) in the second insulating layer INS2 to have a shape surrounding the first opening OPN1 at a position spaced apart from the first opening OPN1, the well portion WL may be formed to surround the first opening OPN1 at a position laterally spaced apart from the first opening OPN1. Accordingly, the organic layer ORL disposed in the well portion WL may have a shape surrounding the first opening OPN1 at a position laterally spaced apart from the first opening OPN1 in plan view.

In various embodiments, the well portion WL and the organic layer ORL may be a separate pattern having a shape individually surrounding the contact portion CNT corresponding to each pad PD. However, embodiments are not limited thereto. For example, the well portion WL and the organic layer ORL may be formed integrally with each other while surrounding each contact portion CNT corresponding to at least two adjacent pads PD. For example, the well portion WL and the organic layer ORL may be formed in a mesh shape including openings overlapping the contact portions CNT.

In various embodiments, the third insulating layer INS3 may be opened in the contact portion CNT and may cover the first conductive layer CDL1 and the organic layer ORL around the contact portion CNT. For example, the third insulating layer INS3 is opened in the contact portion CNT to expose the first conductive layer CDL1, and may cover the second conductive layer portion CDL1*b* of the first conductive layer CDL1 and the organic layer ORL around the contact portion CNT.

In various embodiments, the fourth conductive layer CDL4 may be disposed on the first conductive layer CDL1 in the contact portion CNT. For example, the fourth conductive layer CDL4 may be located in the first opening OPN1 of the contact portion CNT to be in contact with the first conductive layer CDL1. The fourth conductive layer CDL4 may be disposed on the third insulating layer INS3 around the contact portion CNT.

In various embodiments, the fourth conductive layer CDL4 may be formed simultaneously with the electrodes, conductive patterns, and/or wires that may be formed in the display area DA after the formation of the first conductive layer CDL1, using the same material. For example, the fourth conductive layer CDL4 may be formed simultaneously with the electrodes, conductive patterns, and/or wires that may be provided in the first sensor conductive layer TCDL1 and/or the second sensor conductive layer TCDL2, using the same material. In various embodiments, the third insulating layer INS3 may include the first sensor insulating layer 151 and the second sensor insulating layer 152, and the fourth conductive layer CDL4 may be formed simultaneously with the first sensor electrodes TS1 and/or the second sensor electrodes TS2 using the same material.

According to the aforementioned embodiment, the well portion WL may be formed in the second insulating layer INS2 around the contact portion CNT, and the end of the first conductive layer CDL1 may be disposed in the well portion WL and covered with the organic layer ORL. Accordingly, the first conductive layer CDL1 may be prevented from being further etched or damaged in the subsequent process so that defects in the pads PD and the first pad area PP1 including the same may be prevented, and a step may be prevented or reduced by the organic layer ORL. Therefore, it is possible to reduce a pressure, which is applied to the periphery of the contact portion CNT by a conductive ball or the like used to connect the driving circuit 200 onto the first pad area PP1, and to prevent, reduce, or minimize damage to an insulating layer (e.g., a crack, lifting, and/or peeling of the third insulating layer INS3) disposed in the first pad area PP1.

In various embodiments, the second pad area PP2 may have a structure substantially the same as or similar to that of the first pad area PP1. For example, the pads of the second pad area PP2 may have substantially the same or similar cross-sectional structure as the pads PD of the first pad area PP1. Further, an end of a conductive layer, which is included in each pad of the second pad area PP2 and corresponds to the first conductive layer CDL1 of the first pad area PP1 (e.g., a conductive layer disposed in the same layer as the first conductive layer CDL1 and having the same material and a cross-sectional structure thereof) may be disposed in the well portion formed in the second insulating layer INS2 around the pad, and may be covered by the organic layer filled in the well portion.

In another embodiment, the second pad area PP2 may have a different structure from the first pad area PP1. For example, the pads of the second pad area PP2 may have a cross-sectional structure different from the pads PD of the first pad area PP1, and/or the well portion and/or the organic layer may not be provided in the second pad area PP2.

Figure 8:
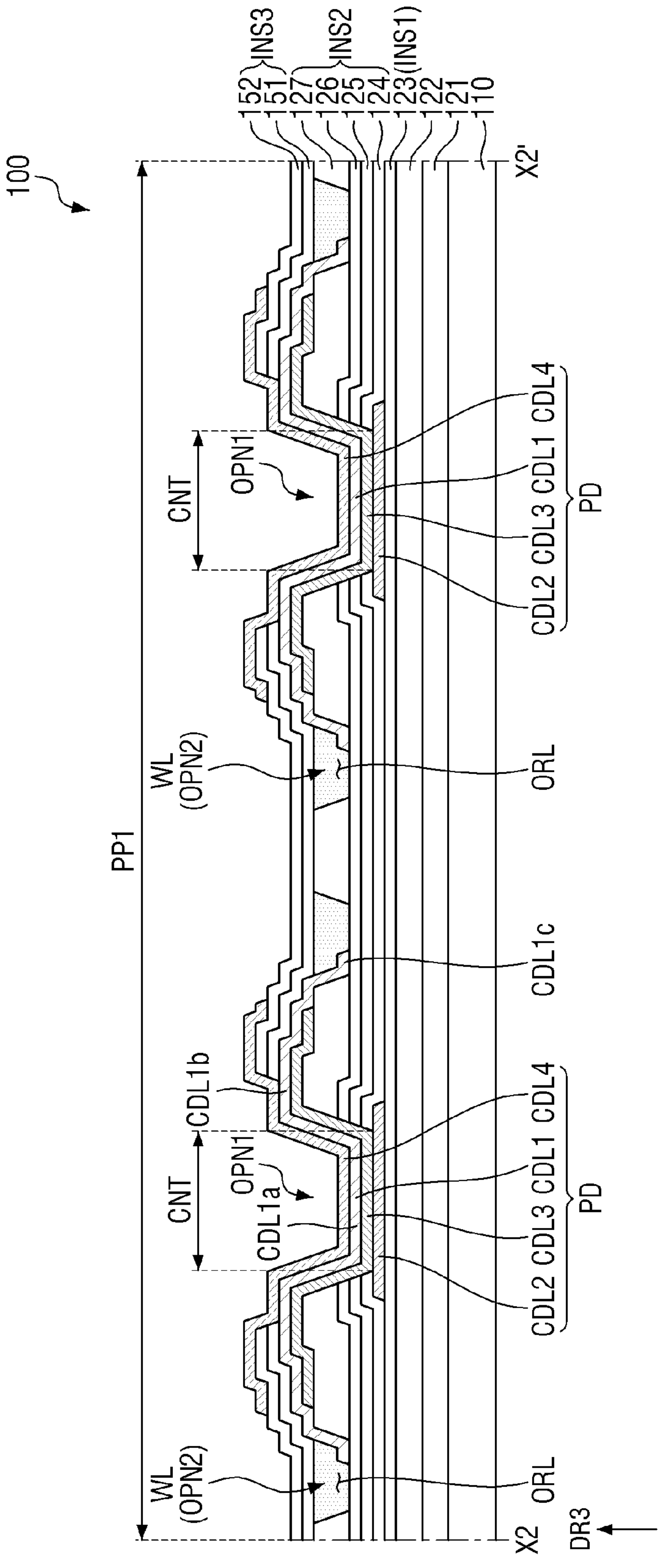
FIG. 8 is a cross-sectional view illustrating the pad area of the display panel according to an embodiment.

FIG. 8 is a cross-sectional view illustrating the pad area of the display panel 100 according to an embodiment. For example, FIG. 8 shows an embodiment different from the embodiment of FIG. 6 with respect to a cross section of a part of the first pad area PP1 taken along line X2-X2' of FIG. 5.

Referring to FIG. 8 in addition to FIGS. 1 to 7, the second insulating layer INS2 may be etched by a partial thickness thereof in the well portion WL. Accordingly, the well portion WL may be provided as a recess formed in the second insulating layer INS2. Further, the end of the first conductive layer CDL1 may be disposed in the well portion WL (recess) of the second insulating layer INS2.

For example, the second insulating layer INS2 may include at least one upper insulating layer (e.g., the second interlayer insulating layer 127) opened to include the second opening OPN2 in the well portion WL, and at least one lower insulating layer (e.g., the second gate insulating layer 124, the first interlayer insulating layer 125, and the third gate insulating layer 126) disposed under the upper insulating layer without being opened in the well portion WL. In various embodiments, the end of the first conductive layer CDL1 may be disposed on the third gate insulating layer 126 in the well portion WL (recess).

Figure 9:
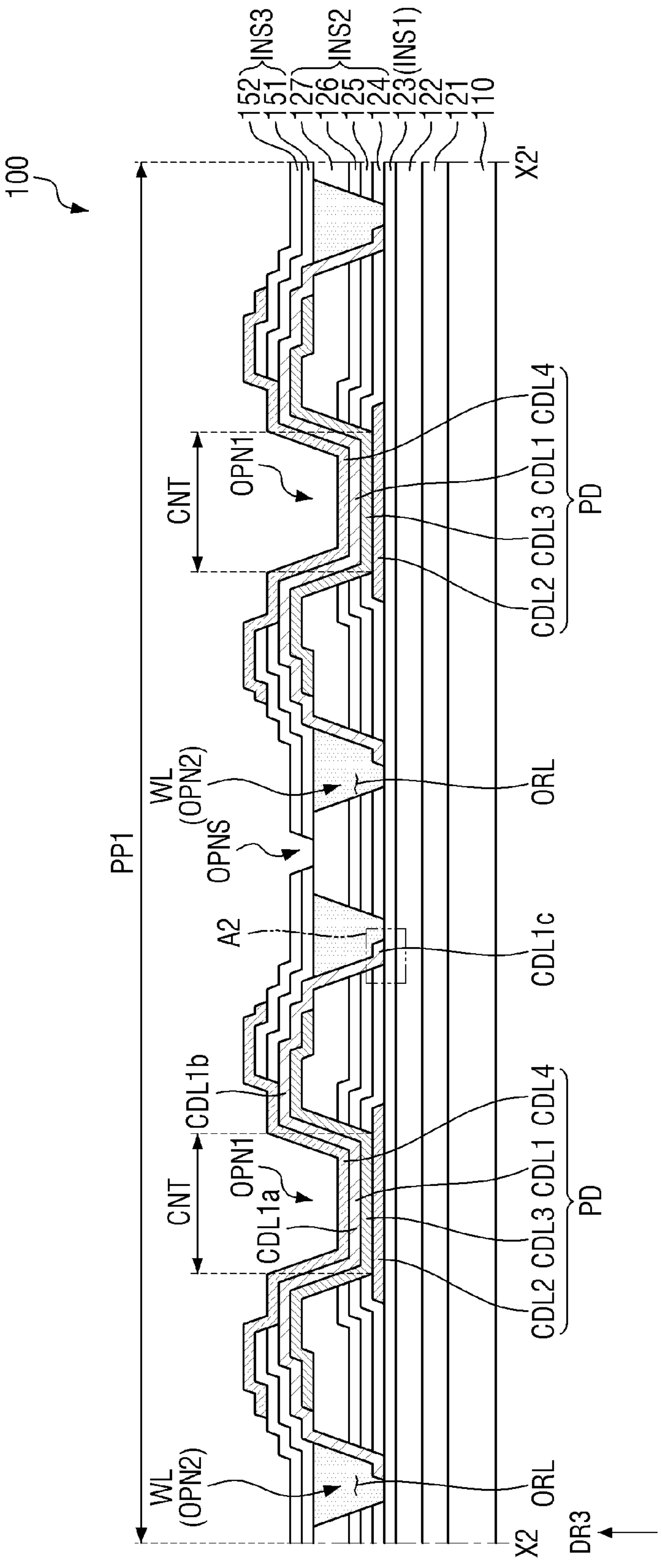
FIG. 9 is a cross-sectional view illustrating the pad area of the display panel according to an embodiment.

FIG. 9 is a cross-sectional view illustrating the pad area of the display panel 100 according to an embodiment. For example, FIG. 9 shows an embodiment different from the embodiment of FIG. 6 with respect to a cross section of a part of the first pad area PP1 taken along line X2-X2' of FIG. 5.

Figure 10:
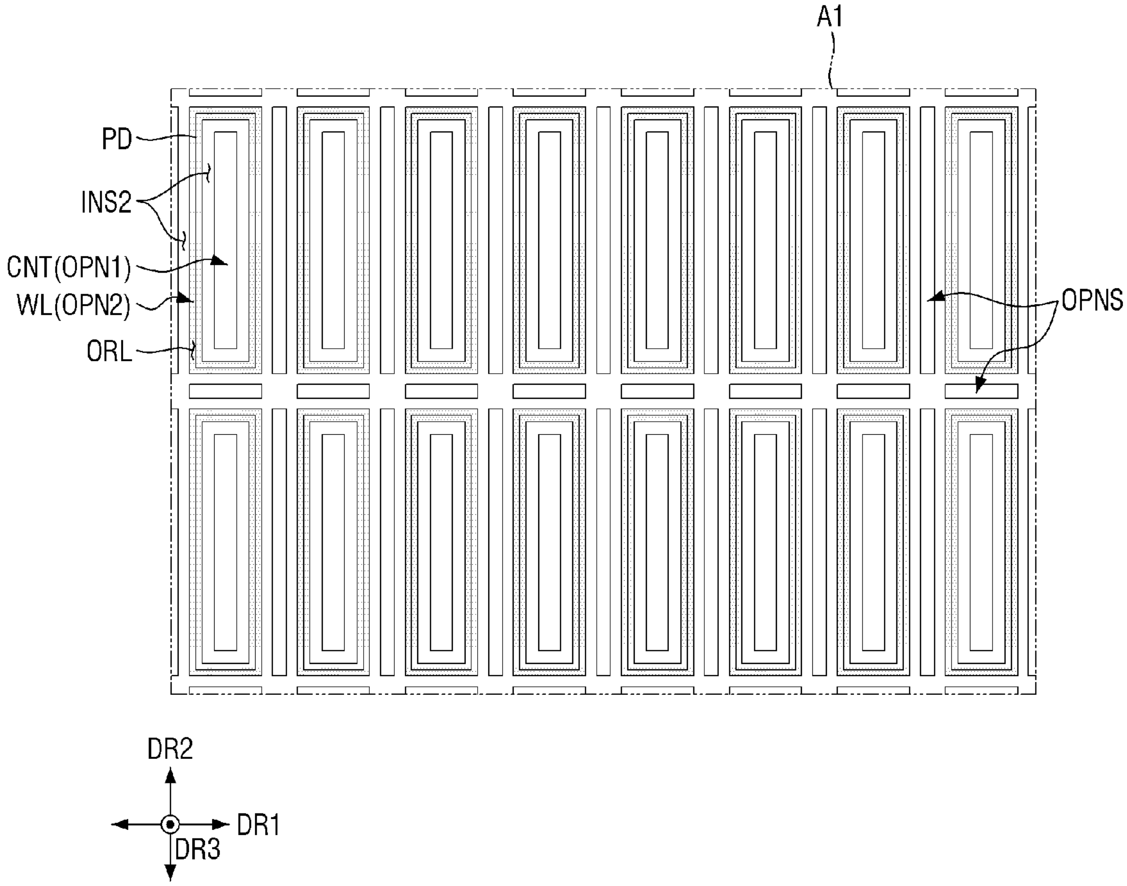
FIG. 10 is a plan view illustrating the pad area of the display panel according to an embodiment.
Figure 11:
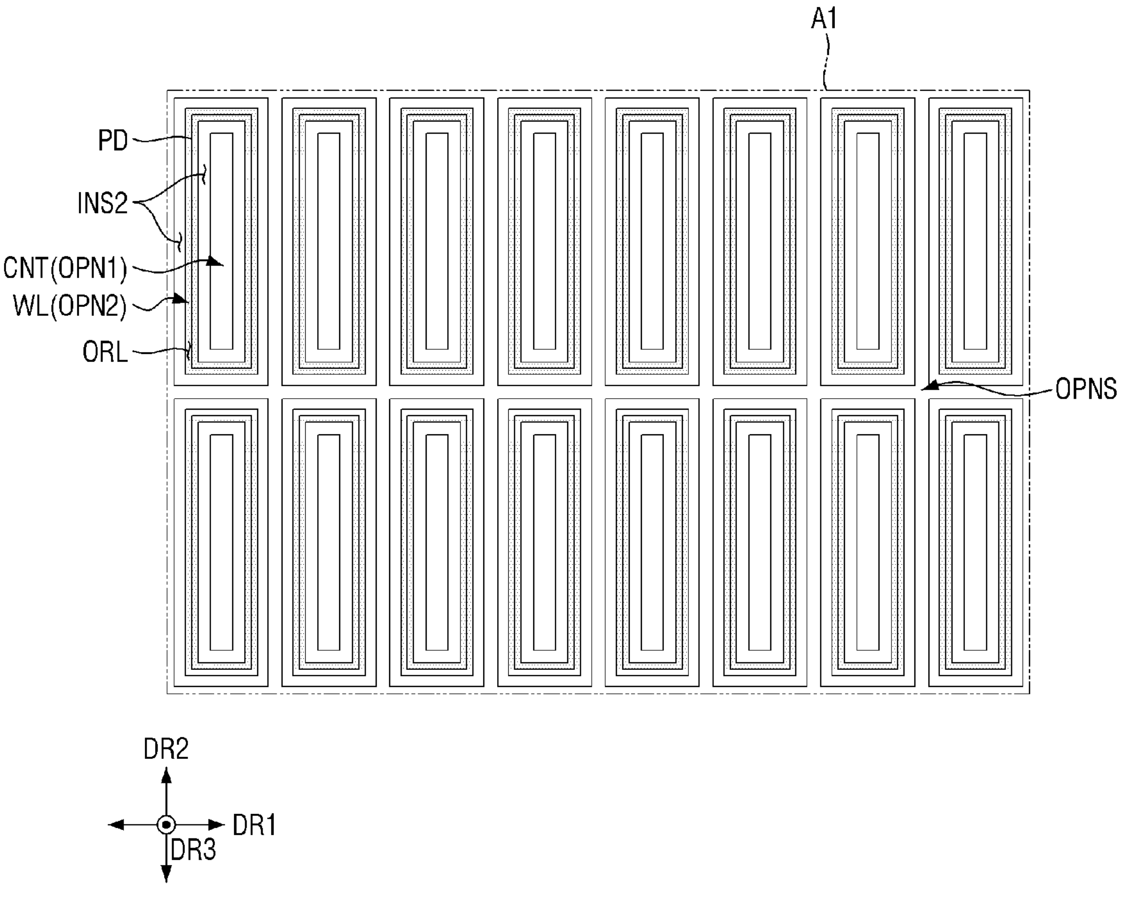
FIG. 11 is a plan view illustrating the pad area of the display panel according to an embodiment.

FIG. 10 is a plan view illustrating the pad area of the display panel 100 according to an embodiment. FIG. 11 is a plan view illustrating the pad area of the display panel 100 according to an embodiment. For example, FIGS. 10 and 11 illustrate different embodiments of an opening OPNS formed in the third insulating layer INS3 of FIG. 9 with respect to a part of the first pad area PP1 corresponding to area A1 of FIG. 4.

Referring to FIGS. 9 to 11 in addition to FIGS. 1 to 8, the third insulating layer INS3 may be opened between the pads PD. For example, the third insulating layer INS3 may include the opening OPNS located between the pads PD. In various embodiments, the opening OPNS of the third insulating layer INS3 may be the slit-shaped opening OPNS that is formed in a narrow space between the pads PD and thus has a narrow width. For example, the opening OPNS of the third insulating layer INS3 may be formed in a thin groove or valley shape.

In various embodiments, the third insulating layer INS3 may include a plurality of openings OPNS separated from each other, as shown in FIG. 10. Alternatively, as shown in FIG. 11, the third insulating layer INS3 may include one opening OPNS in which openings are connected to each other (e.g., an integral opening in which openings are integrated into one).

FIGS. 10 and 11 disclose the embodiments in which at least one opening OPNS is formed in the third insulating layer INS3 to surround each of the pads PD, but the embodiments are not limited thereto. The shape, number, position, arrangement density, and/or the like of the openings OPNS that may be formed in the third insulating layer INS3 may vary according to the various embodiments. The openings OPNS may be formed in the third insulating layer INS3 for at least two pad rows and/or pad columns.

In various embodiments, the opening OPNS is formed in the third insulating layer INS3 between the pads PD, as in the aforementioned embodiment, even if damage occurs in the third insulating layer INS3 or in a part of the first pad area PP1, the damage to the third insulating layer INS3 may be blocked, reduced, or minimized from propagating to the surroundings. For example, by opening the third insulating layer INS3 between the pads PD, even if a crack or lifting (or peeling) occurs in a part of the third insulating layer INS3, the damage to the third insulating layer INS3 may be blocked or minimized from propagating to other surrounding parts.

Figure 12:
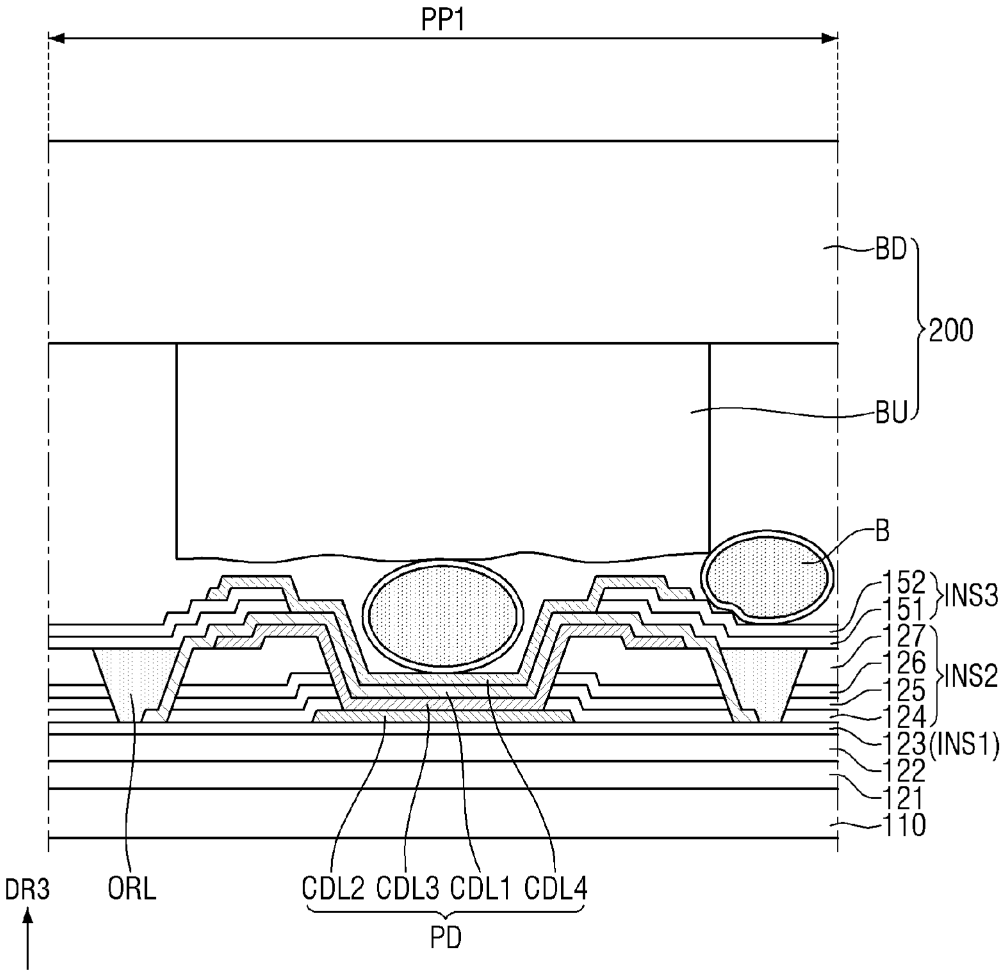
FIG. 12 is a cross-sectional view showing the pad area of the display device according to an embodiment.

FIG. 12 is a cross-sectional view showing the pad area of the display device 10 according to an embodiment. For example, FIG. 12 schematically shows a part of the first pad area PP1 where one pad PD is located and the driving circuit 200 connected to the pad PD.

Referring to FIG. 12 in addition to FIGS. 1 to 11, the driving circuit 200 may be connected to the first pad area PP1. The driving circuit 200 may include a body portion BD and bumps BU provided on a surface of the body portion BD. The bumps BU may be disposed on each pad PD of the first pad area PP1. Each pad PD may be connected to each bump BU via an anisotropic conductive film (ACF), a conductive ball B, and the like. Accordingly, the driving circuit 200 may be electrically connected to the pads PD through the conductive balls B.

When the driving circuit 200 is connected to the pads PD, a pressure may be applied to the insulating layers (e.g., the second insulating layer INS2, the third insulating layer INS3, the organic layer ORL, and/or the like) around the pads PD by the conductive ball B. However, the organic layer ORL can be disposed in the well portion WL of the second insulating layer INS2, while cladding the end of the first conductive layer CDL1 with the organic layer ORL, thereby substantially removing or reducing a step due to the organic layer ORL or the well portion WL. Accordingly, it is possible to reduce or alleviate a pressure that is applied to the third insulating layer INS3 by the conductive ball B, and to prevent, reduce, or minimize the occurrence of a crack, lifting, and/or peeling of the third insulating layer INS3 or the like in the first pad area PP1. For example, when the organic layer ORL is formed on the second insulating layer INS2 without forming the well portion WL on the second insulating layer INS2, the organic layer OR may protrude in the third direction DR3 to be pressed with a greater force by the conductive ball B and transformed, and a crack may occur in the inorganic insulating layer (e.g., the third insulating layer INS3) at the position where the organic layer ORL is pressed. In addition, the third insulating layer INS3 or the like may be lifted or peeled off on the opposite side of the position where the organic layer ORL is pressed. When a high temperature and humidity reliability evaluation is performed in this state, the phenomenon of lifting or peeling of the third insulating layer INS3 may become severe as moisture enters through a crack of the third insulating layer INS3 and the organic layer ORL expands. On the other hand, according to the embodiments, the occurrence of a step may be prevented or minimized by forming the organic layer ORL, and thus it is possible to prevent, reduce, or minimize damage and lifting of the third insulating layer INS3. Accordingly, the reliability of the first pad area PP1 may be improved.

In various embodiments, when the opening OPNS is formed in the third insulating layer INS3 between the pads PD, even if a crack, lifting, and/or peeling occurs in the third insulating layer INS3 or the like in a part of the first pad area PP1, the damage to the third insulating layer INS3 may be blocked, reduced, and minimized from propagating to the surroundings. Accordingly, the reliability of the first pad area PP1 may be further improved.

FIGS. 13 to 18 are cross-sectional views illustrating a method for manufacturing the display device 10 according to an embodiment. For example, FIGS. 13 to 18 sequentially show the manufacturing method of the display panel 100 according to the embodiment of FIGS. 5 to 7.

When manufacturing the display device 10 including the display panel 100 according to the embodiment of FIG. 8 or FIGS. 9 to 11, each display panel 100 may be manufactured by a method substantially similar to the manufacturing method of the display panel 100 according to the embodiment of FIGS. 13 to 18. For example, the display panel 100 according to the embodiment of FIG. 8 may be manufactured by adjusting the etching depth of the second insulating layer INS2. Furthermore, each display panel 100 according to the embodiments of FIGS. 9 to 11 may be manufactured by etching the third insulating layer INS3 between the pads PD to form the opening OPNS.

Figure 13:
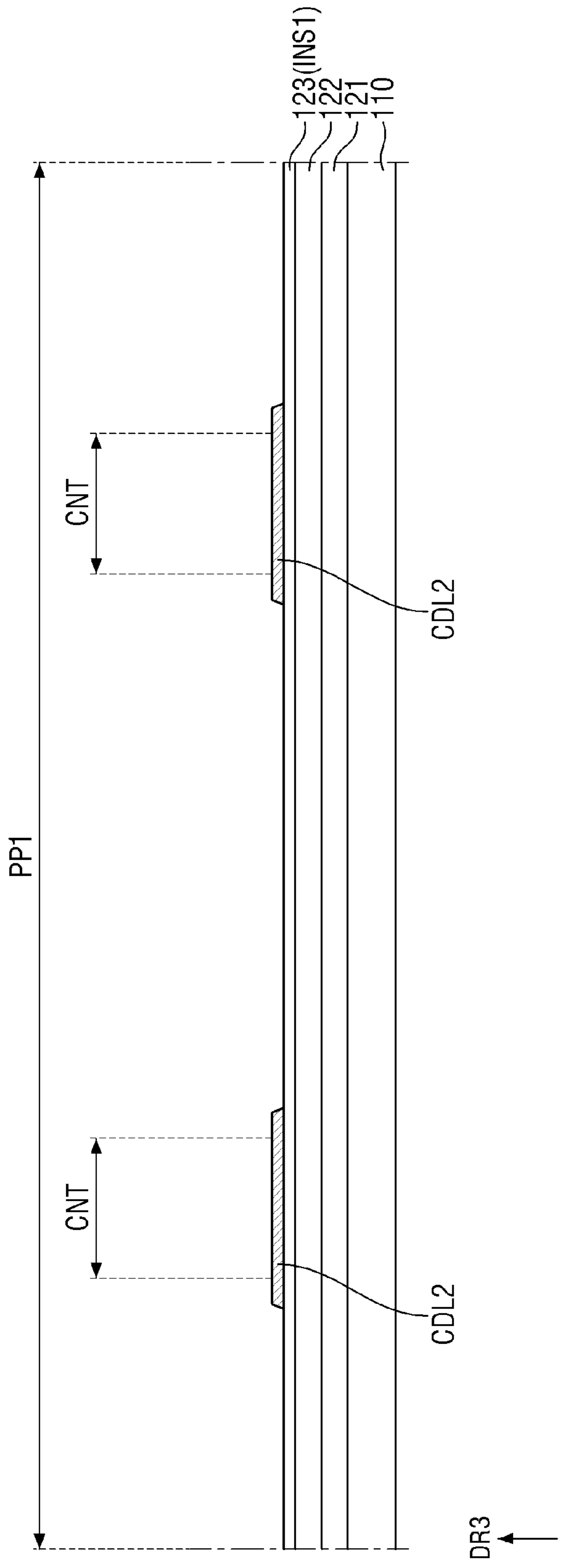
FIGS. 13 to 18 are cross-sectional views illustrating a method for manufacturing the display device according to an embodiment.

Referring to FIG. 13 in addition to FIGS. 1 to 12, the substrate 110 including the display area DA and the non-display area NA may be prepared. The non-display area NA of the substrate 110 may include a pad area, e.g., the first pad area PP1, having the contact portions CNT where each of the pads PD will be formed.

Thereafter, the buffer layer 121 and/or the barrier layer 122 may be formed on the substrate 110, and the first insulating layer INS1 may be formed on the substrate 110 provided with the buffer layer 121 and/or the barrier layer 122. In various embodiments, the first insulating layer INS1 may be the first gate insulating layer 123 and may be formed over the entire surface of the non-display area NA including the first pad area PP1 or the like and the display area DA.

Each of the buffer layer 121, the barrier layer 122, and the first insulating layer INS1 may be formed by a film forming process of an inorganic insulating layer using the at least one inorganic insulating material exemplified above. The process applied to the formation of each of the buffer layer 121, the barrier layer 122, and the first insulating layer INS1 is not particularly limited.

In various embodiments, the second conductive layer CDL2 of the pad PD may be formed on the substrate 110 and the first insulating layer INS1. For example, when each pad PD includes the second conductive layer CDL2, the second conductive layer CDL2 may be formed in each pad area including each contact portion CNT. In various embodiments, the second conductive layer CDL2 may be provided in the first gate conductive layer GCDL1 and may be formed simultaneously with the first gate electrodes G1 of the display area DA. For example, a conductive layer may be formed on the first insulating layer INS1 using the at least one conductive material that is exemplified above as the material of the first gate conductive layer GCDL1, and then the second conductive layer CDL2 may be formed in the pad area including each contact portion CNT by a patterning process of the conductive layer including an etching process.

Figure 14:
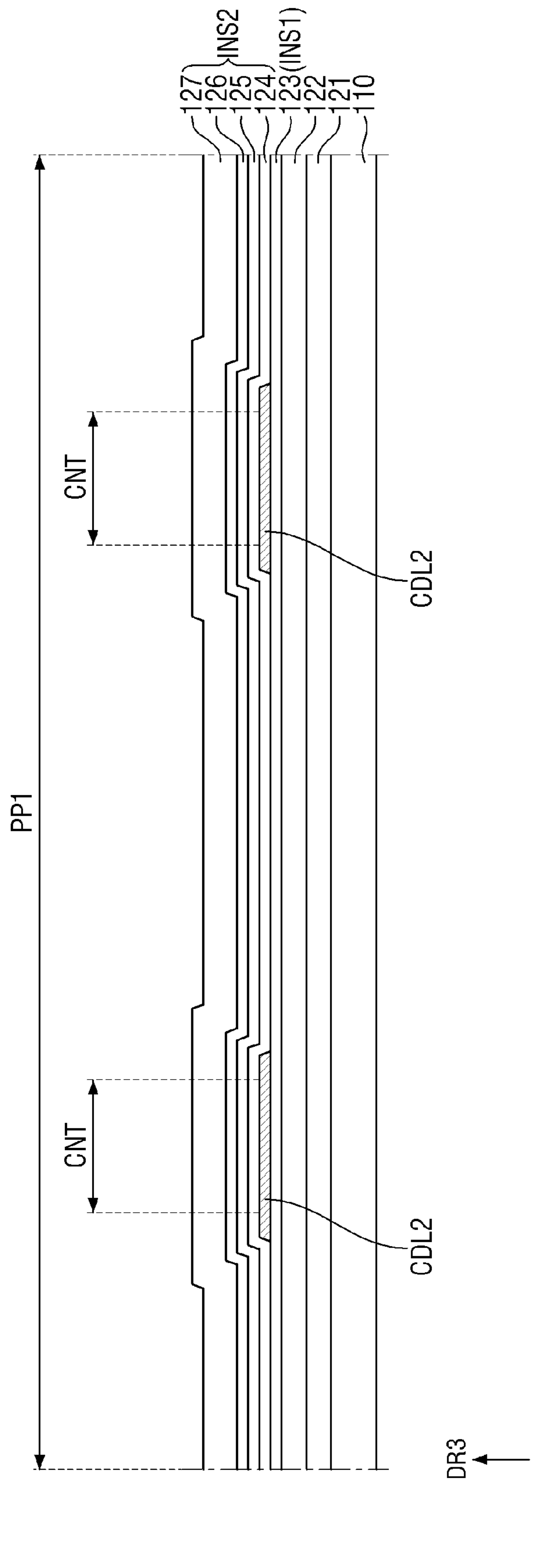

Referring to FIG. 14 in addition to FIGS. 1 to 13, the second insulating layer INS2 may be formed on the substrate 110 provided with the first insulating layer INS1, or the first insulating layer INS1 and the second conductive layer CDL2. For example, the second gate insulating layer 124, the first interlayer insulating layer 125, the third gate insulating layer 126, and the second interlayer insulating layer 127 may be sequentially formed on the substrate 110 provided with the first insulating layer INS and the second conductive layer CDL2.

Each of the second gate insulating layer 124, the first interlayer insulating layer 125, the third gate insulating layer 126, and the second interlayer insulating layer 127 may be formed through the film forming process of an inorganic insulating layer using the at least one inorganic insulating material exemplified above. The process can be applied to the formation of each of the second gate insulating layer 124, the first interlayer insulating layer 125, the third gate insulating layer 126, and the second interlayer insulating layer 127, and is not particularly limited.

Figure 15:
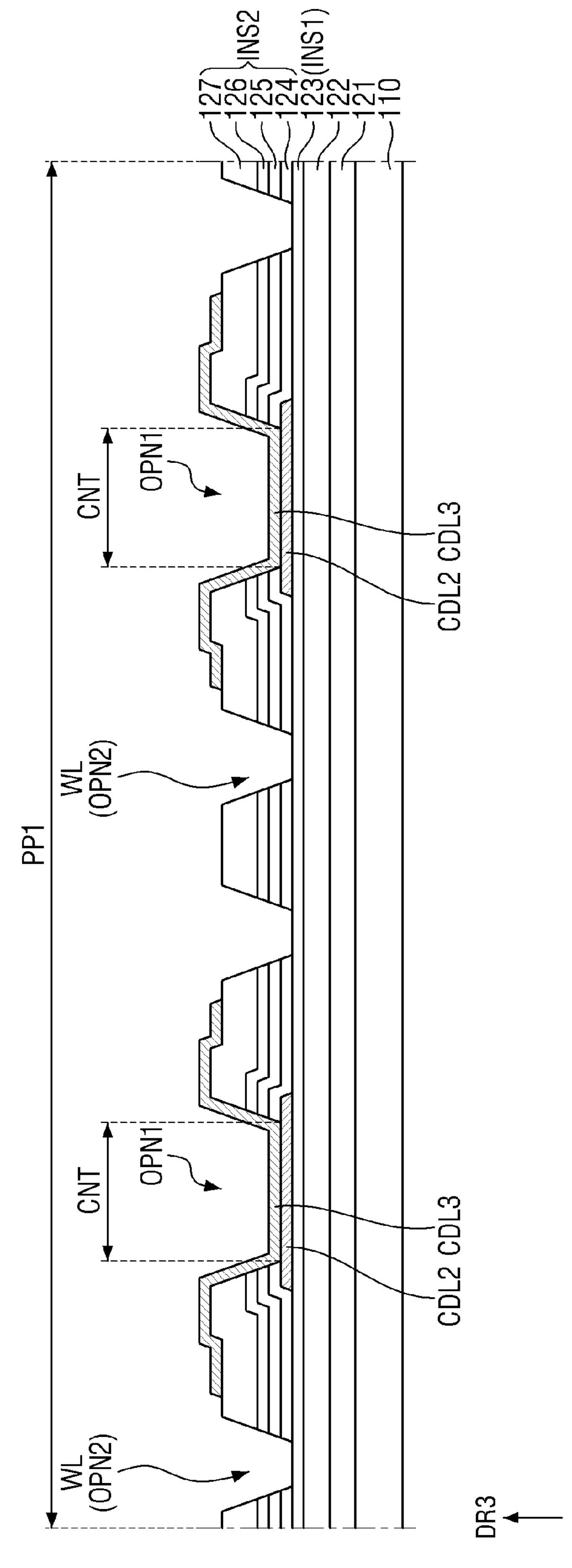

Referring to FIG. 15 in addition to FIGS. 1 to 14, the first openings OPN1 and the well portions WL may be formed in the first pad area PP1 by etching the second insulating layer INS2, where portions of the second gate insulating layer 124, first interlayer insulating layer 125, third gate insulating layer 126, and second interlayer insulating layer 127 may be removed by etching. For example, by etching the second insulating layer INS2 in each contact portion CNT and around the contact portion CNT, the first opening OPN1 may be formed in the second insulating layer INS2 in each contact portion CNT, and the well portion WL may be formed in the second insulating layer INS2 around the contact portion CNT.

In various embodiments, the third conductive layer CDL3 of the pad PD may be selectively formed on the first insulating layer INS1 and the second insulating layer INS2 in each contact portion CNT and around the contact portion CNT. For example, when each pad PD includes the third conductive layer CDL3, the third conductive layer CDL3 may be formed in each pad area including each contact portion CNT. In various embodiments, the third conductive layer CDL3 may be provided in the first source-drain conductive layer SCDL1, and may be formed simultaneously with the first source electrodes S1, the first drain electrodes D1, the second source electrodes S2, the second drain electrodes D2, bridge patterns, wires and/or the like of the display area DA. For example, a conductive layer may be formed on the second insulating layer INS2 using the at least one conductive material that is exemplified above as the material of the first source-drain conductive layer SCDL1, and then the third conductive layers CDL3 may be formed through a patterning process of the conductive layer including an etching process.

Figure 16:
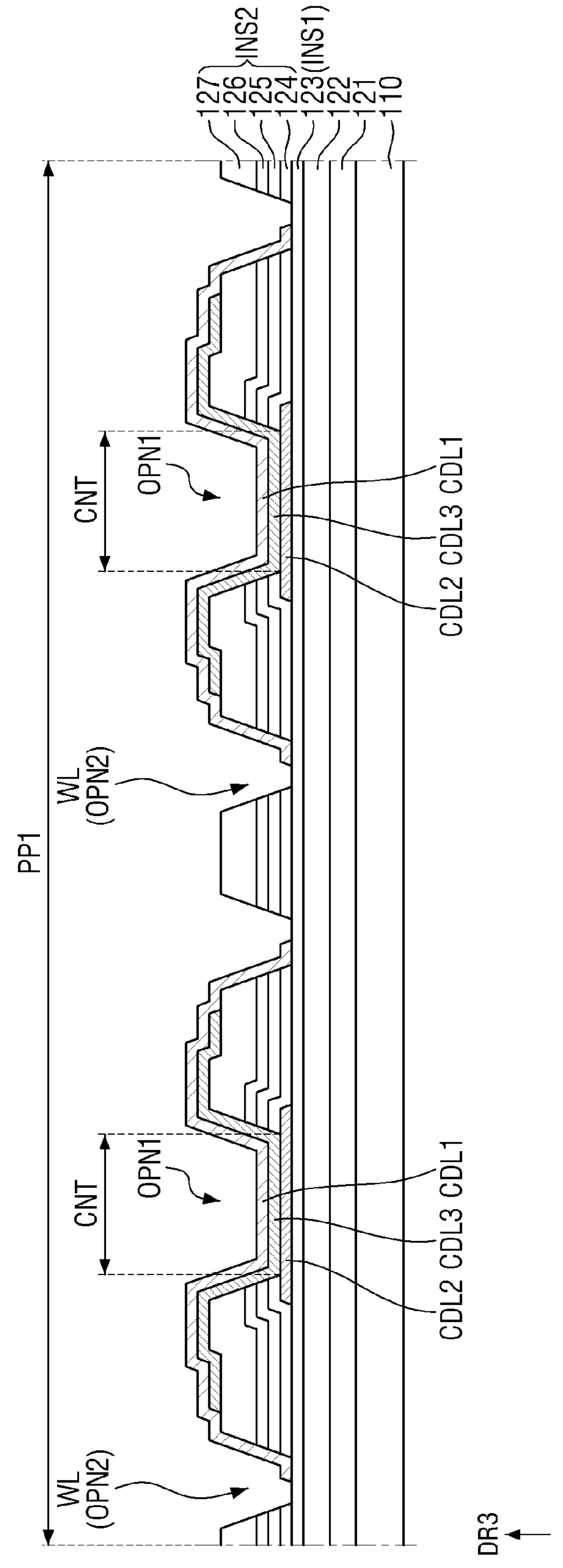

Referring to FIG. 16 in addition to FIGS. 1 to 15, the first conductive layer CDL1 of the pad PD may be formed on the substrate 110 provided with the second insulating layer INS2, or the second insulating layer INS2 and the third conductive layer CDL3. For example, the first conductive layer CDL1 may be formed on the third conductive layer CDL3, the first insulating layer INS1, and the second insulating layer INS2 in each pad area, including each contact portion CNT and the periphery of the contact portion CNT. In various embodiments, the first conductive layer CDL1 may be provided in the second source-drain conductive layer SCDL2, and may be formed simultaneously with the connection electrodes CNE, wires and/or the like of the display area DA. For example, a conductive layer may be formed on the third conductive layer CDL3, the first insulating layer INS1, the second insulating layer INS2, and the like using the at least one conductive material exemplified above as the material of the second source-drain conductive layer SCDL2, and then each first conductive layer CDL1 may be formed through a patterning process of the conductive layer including an etching process. In various embodiments, a film forming process of forming the first conductive layer CDL1 may include a process that sequentially forms the first metal layer MTL1 containing a first metal (e.g., titanium (Ti)), the second metal layer MTL2 containing a second metal (e.g., aluminum (Al)), and the third metal layer MTL3 containing the first metal. The first conductive layer CDL1 may be formed such that its center is located in the first opening OPN1 located in each contact portion CNT, and its end is located in the well portion WL around the contact portion CNT.

Figure 17:
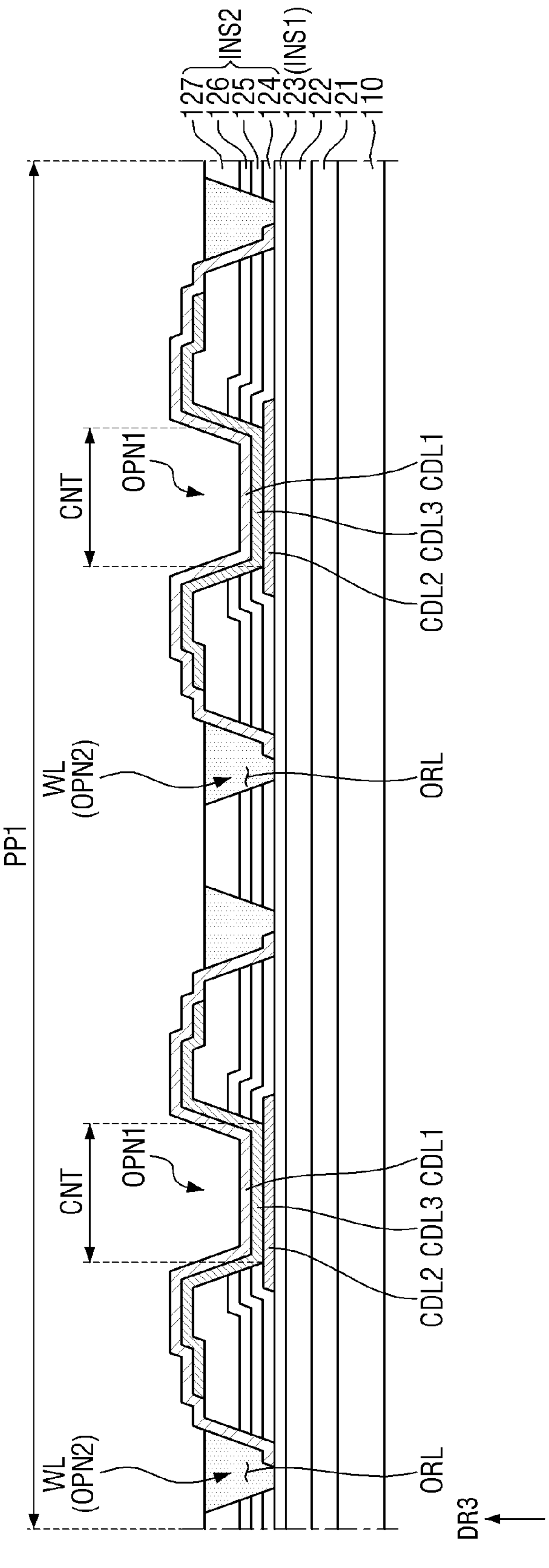

Referring to FIG. 17 in addition to FIGS. 1 to 16, the organic layer ORL may be formed in each well portion WL. A process of forming and planarizing the organic layer ORL in each well portion WL may be performed. Accordingly, the organic layer ORL may fill in the well portion WL and cover the end of the first conductive layer CDL1 of each pad PD, and planarize a step formed in the second insulating layer INS2 due to the well portion WL. In various embodiments, the organic layer ORL may be formed simultaneously with the second planarization layer 129 using the at least one organic insulating material exemplified as a material of the second planarization layer 129 of the display area DA.

Figure 18:
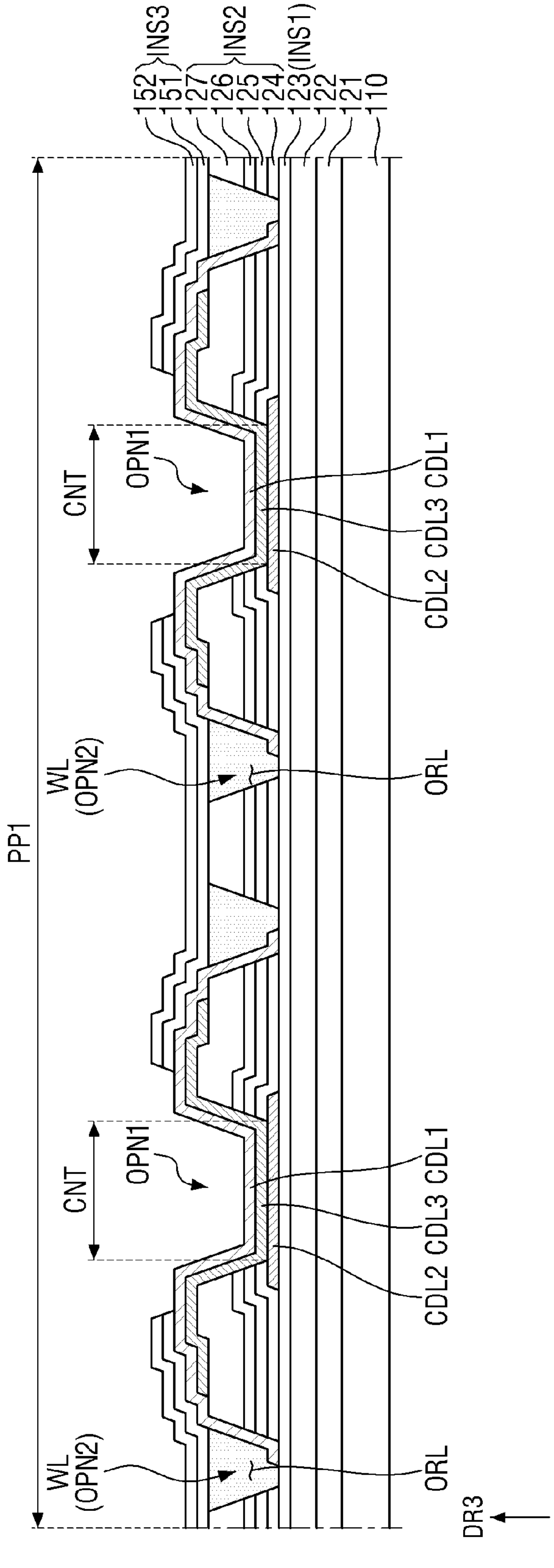

Referring to FIG. 18 in addition to FIGS. 1 to 17, the third insulating layer INS3 may be formed on the substrate 110 provided with the second insulating layer INS2, the first conductive layer CDL1, the organic layer ORL, and the like. For example, the first sensor insulating layer 151 and the second sensor insulating layer 152 may be sequentially formed on the substrate 110, and the second insulating layer INS2, the first conductive layer CDL1, the organic layer ORL, and the like. The first sensor insulating layer 151 and the second sensor insulating layer 152 may be formed through the film forming process of an inorganic insulating layer using the at least one inorganic insulating material exemplified above. The process applied to the formation of each of the first sensor insulating layer 151 and the second sensor insulating layer 152 is not particularly limited.

In various embodiments, the first conductive layer CDL1 of each pad PD may be exposed by etching the third insulating layer INS3 at least in the contact portion CNT. When the third insulating layer INS3 including the openings OPNS is formed as in the embodiments of FIGS. 9 to 11, the third insulating layer INS3 may also be etched between the pads PD, so that the opening OPNS may be formed in the third insulating layer INS3. For example, the slit-shaped opening OPNS may be formed in the third insulating layer INS3 at an edge of the region including the contact portion CNT and the well portion WL (e.g., between the pads PD and/or the peripheral region of the pad PD).

In various embodiments, the fourth conductive layer CDL4 of the pad PD may be selectively formed on the first conductive layer CDL1 in each contact portion CNT, and may be around the contact portion CNT. For example, as shown in FIG. 6, when each pad PD includes the fourth conductive layer CDL4, the fourth conductive layer CDL4 may be formed in each pad area including each contact portion CNT, where the fourth conductive layer CDL4 may extend outside of the contact portion CNT. In various embodiments, the fourth conductive layer CDL4 may be provided in the second sensor conductive layer TCDL2, and may be formed simultaneously with the first sensor electrodes TS1, the second sensor electrodes TS2, sensor lines, and/or the like of the display area DA. For example, the fourth conductive layer CDLA shown in FIG. 6 may be formed with the first sensor electrodes TS1, the second sensor electrodes TS2, and the like through the film forming process and the patterning process of a conductive layer using the at least one conductive material exemplified above as the material of the second sensor conductive layer TCDL2.

In concluding the detailed description, those skilled in the art will appreciate that many variations and modifications can be made to the embodiments without substantially departing from the principles and scope of the present invention. Therefore, the disclosed embodiments of the invention are used in a generic and descriptive sense and not for purposes of limitation.

What is claimed is:

1. A display device comprising:

a substrate including a display area and a pad area;

a first insulating layer on the substrate;

a second insulating layer on the first insulating layer, and comprising a first opening located adjacent to a contact portion of the pad area and a well portion surrounding the contact portion;

a pad on the first insulating layer in the contact portion and around the contact portion, wherein the pad includes a first conductive layer;

an organic layer in the well portion; and a third insulating layer on the second insulating layer and the organic layer, and covering the first conductive layer and the organic layer around the contact portion, wherein the first conductive layer comprises a first conductive layer portion in the first opening, a second conductive layer portion extending from the first conductive layer portion to an edge of the contact portion, and a third conductive layer portion extending from the second conductive layer portion into the well portion, and the organic layer covers the third conductive layer portion of the first conductive layer.

2. The display device of claim 1, wherein the organic layer fills the well portion.

3. The display device of claim 1, wherein the organic layer has a height equal to or less than a height of the second insulating layer, and planarizes a step formed in the second insulating layer due to the well portion.

4. The display device of claim 1, wherein the organic layer surrounds the first opening at a position laterally spaced apart from the first opening.

5. The display device of claim 1, wherein the second conductive layer portion of the first conductive layer is on the second insulating layer.

6. The display device of claim 1, wherein the second insulating layer comprises a second opening exposing the first insulating layer, and an end of the first conductive layer is on the first insulating layer in the well portion.

7. The display device of claim 6, wherein the second insulating layer comprises a plurality of insulating layers including the second opening in the well portion.

8. The display device of claim 1, wherein the second insulating layer comprises a recess, and an end of the first conductive layer is in the recess of the second insulating layer.

9. The display device of claim 8, wherein the second insulating layer comprises an upper insulating layer comprising the second opening in the well portion, and a lower insulating layer under the upper insulating layer.

10. The display device of claim 1, wherein the first conductive layer comprises a first metal layer containing a first metal, a second metal layer on the first metal layer and containing a second metal, and a third metal layer on the second metal layer and containing the first metal, and the organic layer covers an end of the first conductive layer.

11. A display device comprising:

a substrate including a display area and a pad area;

a first insulating layer on the substrate;

a second insulating layer on the first insulating layer, and comprising a first opening located adjacent to a contact portion of the pad area and a well portion surrounding the contact portion;

a pad on the first insulating layer in the contact portion and around the contact portion, wherein the pad includes a first conductive layer;

an organic layer in the well portion; and a third insulating layer on the second insulating layer and the organic layer, and covering the first conductive layer and the organic layer around the contact portion, wherein the first conductive layer comprises a first conductive layer portion in the first opening, a second conductive layer portion extending from the first conductive layer portion to an edge of the contact portion, and a third conductive layer portion extending from the second conductive layer portion into the well portion, and the organic layer covers the third conductive layer portion of the first conductive layer, wherein the pad further comprises at least one of:

a second conductive layer between the first insulating layer and the first conductive layer, exposed by the first opening in the contact portion, and covered with the second insulating layer around the contact portion; and a third conductive layer between the second conductive layer and the first conductive layer, disposed in the first opening in the contact portion, and on the second insulating layer around the contact portion.

12. The display device of claim 11, further comprising a pixel comprising a transistor disposed in the display area, wherein the transistor comprises an active layer between the substrate and the first insulating layer, a gate electrode on the first insulating layer, and a source electrode and/or a drain electrode on the second insulating layer.

13. The display device of claim 12, further comprising a planarization layer disposed on the transistor and containing an organic insulating material, wherein the organic layer contains a same organic insulating material as the planarization layer.

14. The display device of claim 13, further comprising a connection electrode disposed between the transistor and the planarization layer in the display area, wherein the first conductive layer contains a same conductive material as the connection electrode.

15. The display device of claim 12, wherein the second conductive layer contains a same conductive material as the gate electrode, and the third conductive layer contains a same conductive material as the source electrode and/or a drain electrode.

16. The display device of claim 11, further comprising a plurality of pads located in the pad area, wherein the third insulating layer comprises a slit-shaped opening located between the pads.

17. The display device of claim 11, wherein the pad further comprises a fourth conductive layer on the first conductive layer in the contact portion and on the third insulating layer around the contact portion.

18. The display device of claim 17, further comprising pixels in the display area, and sensor electrodes disposed on the pixels, wherein the third insulating layer comprises at least one insulating layer between the pixels and the sensor electrodes.

19. A method for manufacturing a display device, comprising:

sequentially forming a first insulating layer and a second insulating layer on a substrate comprising a pad area comprising a contact portion;

forming a first opening in the second insulating layer in the contact portion, and forming a well portion in the second insulating layer around the contact portion, by etching the second insulating layer in the contact portion and around the contact portion;

forming a first conductive layer of a pad on the first insulating layer and the second insulating layer in the contact portion and around the contact portion; and forming an organic layer in the well portion, wherein the first conductive layer is formed such that a center of the first conductive layer is located in the first opening, and an end of the first conductive layer is located in the well portion, and the organic layer is filled in the well portion to cover the end of the first conductive layer and planarize a step formed in the second insulating layer due to the well portion.

20. The method of claim 19, further comprising forming a third insulating layer on the first conductive layer and the organic layer around the contact portion, and forming a slit-shaped opening in the third insulating layer at an edge of a region comprising the contact portion and the well portion.

* * * * *